United States Patent
Baeck et al.

(10) Patent No.: US 10,431,272 B2
(45) Date of Patent: Oct. 1, 2019

(54) VOLTAGE CONTROL CIRCUIT INCLUDING ASSIST CIRCUIT AND MEMORY DEVICE INCLUDING THE SAME

(71) Applicant: SAMSUNG ELECTRONICS CO., LTD., Suwon-si, Gyeonggi-Do (KR)

(72) Inventors: Sang-yeop Baeck, Yongin-si (KR); Siddharth Gupta, Hwaseong-si (KR); In-hak Lee, Daegu (KR); Jae-seung Choi, Hwaseong-si (KR); Tae-hyung Kim, Yongin-si (KR); Dae-young Moon, Yongin-si (KR); Dong-wook Seo, Hwaseong-si (KR)

(73) Assignee: SAMSUNG ELECTRONICS CO., LTD., Suwon-si, Yeongtong-Gu (KR)

( * ) Notice: Subject to any disclaimer, the term of this patent is extended or adjusted under 35 U.S.C. 154(b) by 0 days.

(21) Appl. No.: 15/921,771

(22) Filed: Mar. 15, 2018

(65) Prior Publication Data

US 2019/0080736 A1   Mar. 14, 2019

(30) Foreign Application Priority Data

Sep. 12, 2017  (KR) .................. 10-2017-0116657

(51) Int. Cl.
*G11C 8/08* (2006.01)
*G11C 5/14* (2006.01)
*G11C 11/419* (2006.01)

(52) U.S. Cl.
CPC .............. *G11C 8/08* (2013.01); *G11C 5/14* (2013.01); *G11C 11/419* (2013.01)

(58) Field of Classification Search
CPC ............ G11C 8/08; G11C 11/419; G11C 5/14
See application file for complete search history.

(56) References Cited

U.S. PATENT DOCUMENTS

| 7,570,525 | B2 | 8/2009 | Nii et al. |
| 7,643,372 | B2 | 1/2010 | Yamagami |
| 8,279,684 | B2 | 10/2012 | Chen et al. |
| 9,236,113 | B2 | 1/2016 | Holla et al. |
| 2008/0037358 | A1* | 2/2008 | Yabuuchi ............... G11C 5/147 365/230.06 |
| 2014/0112065 | A1 | 4/2014 | Tanabe |
| 2015/0371686 | A1 | 12/2015 | Van Winkelhoff et al. |
| 2017/0301396 | A1* | 10/2017 | Dhori .................... G11C 11/419 |

FOREIGN PATENT DOCUMENTS

| JP | 5819791 | 2/1983 |
| JP | 5659893 | 1/2015 |
| JP | 2014086112 | 5/2017 |

* cited by examiner

*Primary Examiner* — Mohammed A Bashar
(74) *Attorney, Agent, or Firm* — F. Chau & Associates, LLC

(57) ABSTRACT

Provided are a voltage control circuit including an assist circuit and a memory device including the voltage control circuit. The memory device includes: a volatile memory cell array, which is connected to a plurality of word lines and includes a memory cell including at least one transistor; and an assist circuit, which is connected to at least one of the plurality of word lines and adjusts a driving voltage level of each of the plurality of word lines, wherein the assist circuit includes a diode N-channel metal oxide semiconductor (NMOS) transistor having a gate and a drain connected to each other.

21 Claims, 16 Drawing Sheets

VOLTAGE CONTROL CIRCUIT INCLUDING ASSIST CIRCUIT AND MEMORY DEVICE INCLUDING THE SAME

CROSS-REFERENCE TO RELATED APPLICATION

This application claims the benefit of Korean Patent Application No. 10-2017-0116657, filed on Sep. 12, 2017, in the Korean Intellectual Property Office, the disclosure of which is incorporated herein by reference in its entirety.

BACKGROUND

Technical Field

The inventive concept relates to a voltage control circuit and a memory device, which include an assist circuit for reducing read disturb errors.

Discussion of the Related Art

Semiconductor memory devices are memory devices implemented by using semiconductors such as silicon (Si), germanium (Ge), gallium arsenide (GaAs), indium phosphide, and the like. Semiconductor memory devices may be broadly classified into volatile memory and nonvolatile memory.

Volatile memory refers to memory in which stored data is destroyed when the supply of power is cut off. Examples of volatile memory devices include static random access memory (SRAM), dynamic random access memory (DRAM), latches, flip-flops, and registers.

As finer processes are used in memory fabrication, and/or memories are configured for lower operating voltages, a "read disturb" phenomenon may occur in which erroneous writing is performed on a memory cell in the process of reading, or writing is performed on a memory cell that is not a writing target in the process of writing.

SUMMARY

The inventive concept provides a memory device including an assist circuit, which adjusts a word line driving voltage depending upon characteristics of a memory cell or temperature.

The inventive concept also provides a voltage control circuit including an assist circuit, which adjusts a word line driving voltage depending upon characteristics of a memory cell or temperature.

According to an aspect of the inventive concept, there is provided a memory device including: a volatile memory cell array connected to a plurality of word lines and including a memory cell that includes at least one transistor; a word line driver connected to the plurality of word lines; and an assist circuit connected to the word line driver and configured to adjust a word line driving voltage of a word line among the plurality of word lines, where the assist circuit includes a diode N-channel metal oxide semiconductor (NMOS) transistor having a diode connection structure (e.g., a gate and a drain connected to each other).

According to another aspect of the inventive concept, there is provided a memory device including: a volatile memory cell array connected to word lines and including a memory cell that includes at least one transistor; a word line driver driving each of the word lines by applying a word line driving voltage to each of the word lines in response to a word line driving signal; a driving power supply circuit connected to the word line driver via a first node and applying a power supply voltage to the first node in response to a supply voltage switching signal; and an assist circuit including at least one NMOS transistor and controlling a level of the word line driving voltage by reducing a level of the power supply voltage at the first node based on characteristics of the at least one NMOS transistor, wherein the assist circuit adjusts the level of the word line driving voltage depending upon at least one of cell characteristics of the at least one NMOS transistor, or temperature.

According to yet another aspect of the inventive concept, there is provided a voltage control circuit included in static random access memory (SRAM), the voltage control circuit including: an NMOS transistor having a diode connection structure (e.g. gate shorted to drain); and a switching transistor having one end connected to the one end of the diode NMOS transistor and another end connected to a word line and being controlled to perform switching between the diode NMOS transistor and the word line, where the voltage control circuit adjusts a level of a driving voltage of the word line based on characteristics of the diode NMOS transistor, depending upon at least one of threshold voltage characteristics of a memory cell of SRAM, or temperature.

According to still another aspect of the inventive concept, there is provided memory device comprising: a volatile memory cell array connected to a plurality of word lines and comprising a memory cell that comprises at least one transistor; an assist circuit connected to the plurality of word lines and configured to adjust a word line driving voltage of a selected word line, where the assist circuit comprises a plurality of NMOS transistors each having a diode connection structure; and an assist switching circuit comprising a plurality of switching transistors, each respectively performing switching between a corresponding one of the plurality of NMOS transistors and a corresponding word line of the plurality of word lines.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
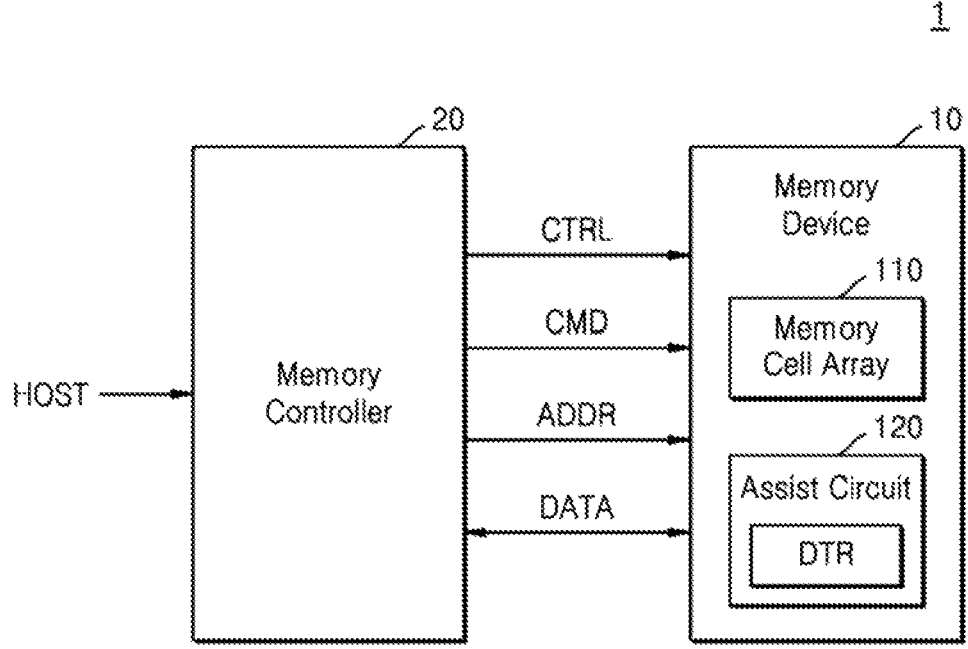
FIG. 1 is a block diagram illustrating a memory system according to an example embodiment of the inventive concept.

FIG. 1 is a block diagram illustrating a memory system 1 according to an example embodiment of the inventive concept. Memory system 1 may include a memory device 10 and a memory controller 20.

In one embodiment, the memory system 1 may be mounted, in the form of a system-on-chip (SOC), in electronic devices such as computers, laptops, cellular phones, smart phones, MP3 players, personal digital assistants (PDAs), portable multimedia players (PMPs), digital TVs, digital cameras, portable game consoles, modems, and the like.

The memory controller 20 may read data (DATA) from the memory device 10 or write DATA into the memory device 10, in response to read/write requests from a host HOST. For this purpose, the memory controller 20 may output a control signal CTRL, a command CMD, an address ADDR, so that DATA is output from, or received by the memory device 10.

The memory device 10 is a device for storing data, and may include a memory cell array 110 and an assist circuit 120. The memory device 10 may be a volatile memory device such as dynamic random access memory (DRAM) (for example, double data rate synchronous dynamic random access memory (DDR SDRM), low power double data rate (LPDDR) SDRAM, graphics double data rate (GDDR) SDRAM, Rambus dynamic random access memory (RDRAM)) or static random access memory (SRAM), or may be a nonvolatile memory device such as NAND flash memory, vertical NAND (VNAND) flash memory, NOR flash memory, resistive RAM (RRAM), phase-change RAM (PRAM), magnetoresistive RAM (MRAM), ferroelectric RAM (FRAM), or spin transfer torque RAM (STT-RAM). Hereinafter, the memory device 10 will be described as being static random access memory (SRAM).

The memory cell array 110 may include a plurality of memory cells storing data, where the memory cells may be accessed through use of word lines and bit lines. The assist circuit 120 may be connected to a word line and adjust a word line driving voltage. Specifically, the assist circuit 120 may adjust the word line driving voltage from a voltage level otherwise applied to a row of memory cells, by slightly pulling down (reducing) the voltage. The amount of voltage reduction may depend upon characteristics of the memory cells included in the memory cell array 110, and/or temperature (where temperature may herein refer to ambient temperature around memory device 10, temperature at a surface of the memory device 10 itself, or operating temperature of memory device 10). The reduction in word line voltage may serve to reduce the occurrence of "read disturb" errors. For instance, one or more transistors within the assist circuit 120 may have a temperature-dependent performance characteristic correlated with a temperature-dependent performance characteristic of transistors within the memory cells, such that a desired reduction in word line voltage is achievable over a range of temperatures.

In one embodiment, each of the memory cells included in the memory cell array 110 may include at least one transistor, and the memory cells may be classified into fast cells and slow cells depending upon characteristics of the at least one transistor. Specifically, the fast cells may refer to cells in which the at least one transistor has a threshold voltage at a relatively low level, and the slow cells may refer to cells in which the at least one transistor has a threshold voltage at a relatively high level. Herein, that a memory cell has characteristics of a fast cell may mean that the threshold voltage of the at least one transistor included in the memory cell is relatively low, and that a memory cell has characteristics of a slow cell may mean that the threshold voltage of the at least one transistor included in the memory cell is relatively high.

Herein, the assist circuit 120 may be said to "adjust" a word line voltage according to temperature just by exhibiting such an inherent temperature-dependent characteristic. In some embodiments, the assist circuit 120 may adjust the word line voltage by means of a plurality of voltage reduction control signals applied to individual transistors thereof (exemplified later in the embodiment of FIG. 8).

At least one transistor within the assist circuit 120 may be configured to have a characteristic (such as a threshold voltage) correlated in some way with the threshold voltages of the memory cells. For example, a threshold voltage of an assist circuit 120 transistor may closely match that of a memory cell transistor. The correlation in Characteristics may be such that the reduction in word line voltage caused by the assist circuit 120 is in a satisfactory range for those memory cells, e.g., sufficient to reduce the read disturb errors below a requisite target. For instance, threshold voltages of transistors within each of the memory cells and the assist circuit 120 may differ from a reference value in approximately the same way due to a common manufacturing process variation. If memory cell transistors have a fast (or slow) characteristic, a similar fast (or slow) characteristic may be exhibited by an assist circuit 120 transistor. By utilizing transistors fabricated with such closely matching characteristics as those in the memory cells, the assist circuit 120 may herein be said to "self-adjust" the word line voltage depending upon characteristics of the memory cells.

As finer memory fabrication processes are performed or memory cell transistors are operated at lower operation voltages, there may occur a read disturb phenomenon, in which erroneous writing is performed on the memory cell in the process of reading, or in which writing is performed on the memory cell that is not a writing target in the process of writing. As mentioned, it is known conventionally to lessen the read disturb phenomenon for certain memory cell configurations by reducing a level of the word line driving voltage. However, to simultaneously secure a read margin, the level of the word line driving voltage should vary according to temperature or fast/slow characteristics of the memory cells.

According to one embodiment of the inventive concept, to adjust the word line driving voltage, the assist circuit 120 may include a diode N-channel metal oxide semiconductor (NMOS) transistor, hereafter "DTR" for brevity (where the acronym "DTR" is also used as a legend for the proximate transistor in the various figures herein). The DTR may have a driving capability that is higher with increasing temperature (positively correlated with temperature). The DTR may also have a high driving capability when at least one NMOS transistor included in the memory cell has characteristics of a fast cell. Due to such characteristics of the DTR, the assist circuit 120 may thus reduce the level of the word line driving voltage more when temperature is high or when the memory cell has characteristics of a fast cell, thereby lessening or preventing the read disturb phenomenon while securing a sufficient read margin.

Figure 2:
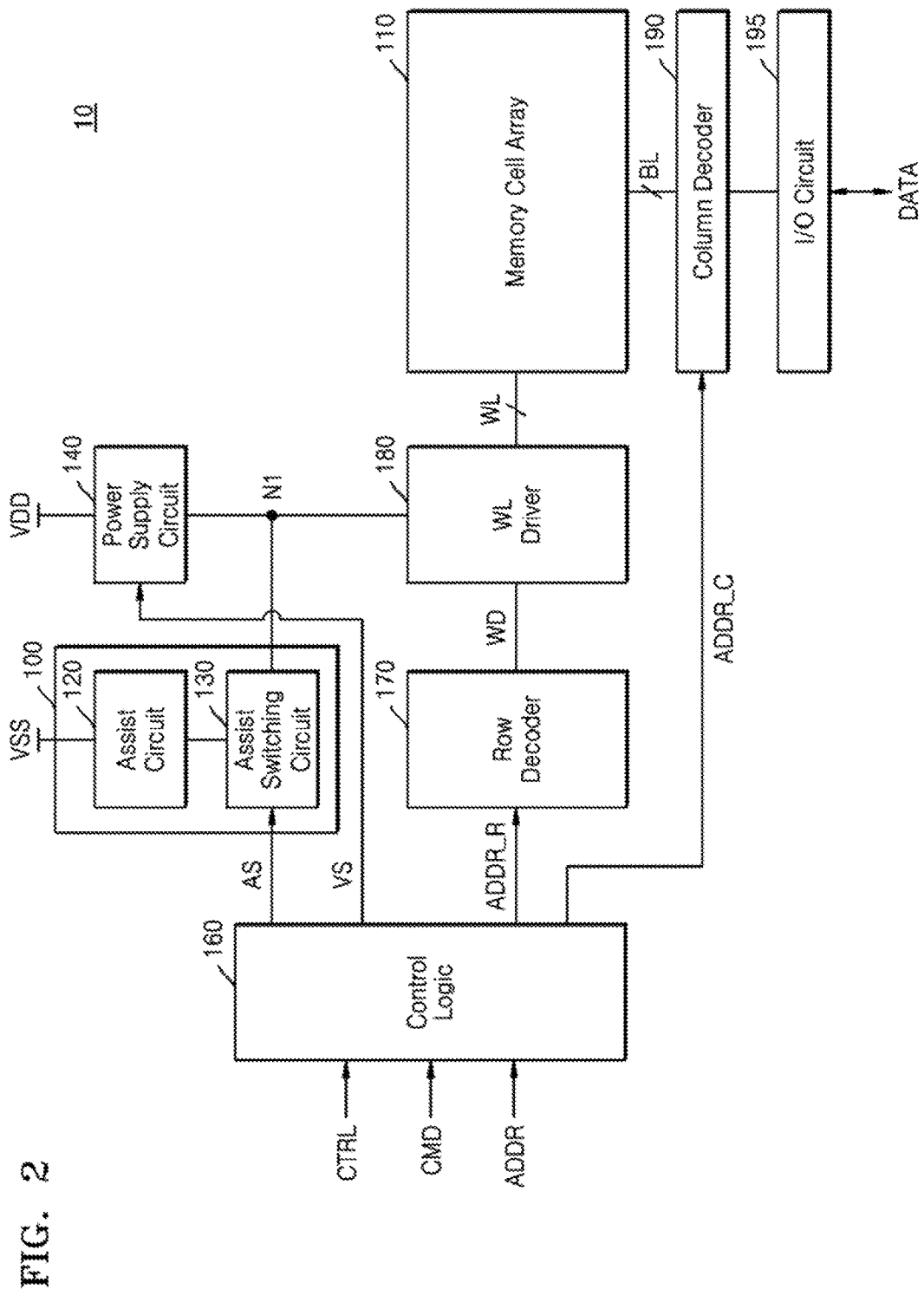
FIG. 2 is a block diagram illustrating a memory device according to an example embodiment of the inventive concept.

FIG. 2 is a block diagram illustrating an example of the memory device 10. Descriptions of features identical to those made with reference to FIG. 1 will be omitted. As shown in FIG. 2, the memory device 10 may include the memory cell array 110, a voltage control circuit 100, a power supply circuit 140, control logic 160, a row decoder 170, a word line driver 180, a column decoder 190, and an input/output circuit 195. The voltage control circuit 100 may include the assist circuit 120 and an assist switching circuit 130. Since the memory cell array 110 and the assist circuit 120 have been described with reference to FIG. 1, descriptions thereof will be omitted.

The voltage control circuit 100 may be connected to the power supply circuit 140 at a first node N1, and adjust the level of the word line driving voltage supplied to the word line driver 180. For this purpose, in one embodiment, the voltage control circuit 100 may be tied to a reference potential VSS (e.g. ground). The assist switching circuit 130 included in the voltage control circuit 100 may perform switching between the assist circuit 120 and the first node N1 based on an assist switching signal AS received from the control logic 160. For this purpose, the assist switching circuit 130 may include at least one switching element (for example, a transistor).

The power supply circuit 140 may apply voltage derived from a power supply voltage VDD to the first node N1 based on a voltage switching signal VS received from the control logic 160. For this purpose, the power supply voltage VDD may be applied to the power supply circuit 140, and the power supply circuit 140 may include at least one switching element (for example, a transistor). Hereafter, the power supply voltage VDD may be referred to (interchangeably) as a main power supply voltage.

The control logic 160 may receive the control signal CTRL, the command CMD, and the address ADDR from the memory controller 20 (FIG. 1), and generate various control signals based thereon. The control logic 160 may generate the assist switching signal AS and output the assist switching signal AS to the assist swathing circuit 130 such that the voltage control circuit 100 is activated while a word line WL is driven. Because the assist circuit 120 is connected to the first node N1 during the driving of the word line WL, a voltage level of the first node N1 may be pulled down lower than that of the power supply voltage VDD. The control logic 160 may generate a row address ADDR_R and a column address ADDR_C based on the address ADDR received from the memory controller 20 (FIG. 1), output the row address ADDR_R to the row decoder 170, and output the column address ADDR_C to the column decoder 190.

The row decoder 170 may decode the received row address ADDR_R and thereby activate the word line WL corresponding to the row address ADDR_R. In one embodiment, the row decoder 170 may output a word line driving signal WD to the word line driver 180 corresponding to the row address ADDR_R.

The word line driver 180 may apply the voltage provided at the first node N1 to the word line WL corresponding to the row address ADDR_R in response to the word line driving signal WD. In one embodiment, the word line driver 180 may include at least one inverter.

The column decoder 190 may activate a sense amplifier corresponding to the column address ADDR_C through the input/output circuit 195. The input/output (I/O) circuit 195 may include circuits gating input and output data, input data mask logic, read data latches for storing data output from the memory cell array 110, and a write driver for writing data into the memory cell array 110. Data read from the memory cell array 110 may be sensed and amplified by the sense amplifier, and stored in the read data latches. The data stored in the read data latches may be provided to the memory controller through a data I/O buffer (not shown). Data that is to be written into the memory cell array 110 may be provided from the memory controller to the data I/O buffer. The data provided to the data I/O buffer may be written into the memory cell array 110 through the write driver.

Figure 3:
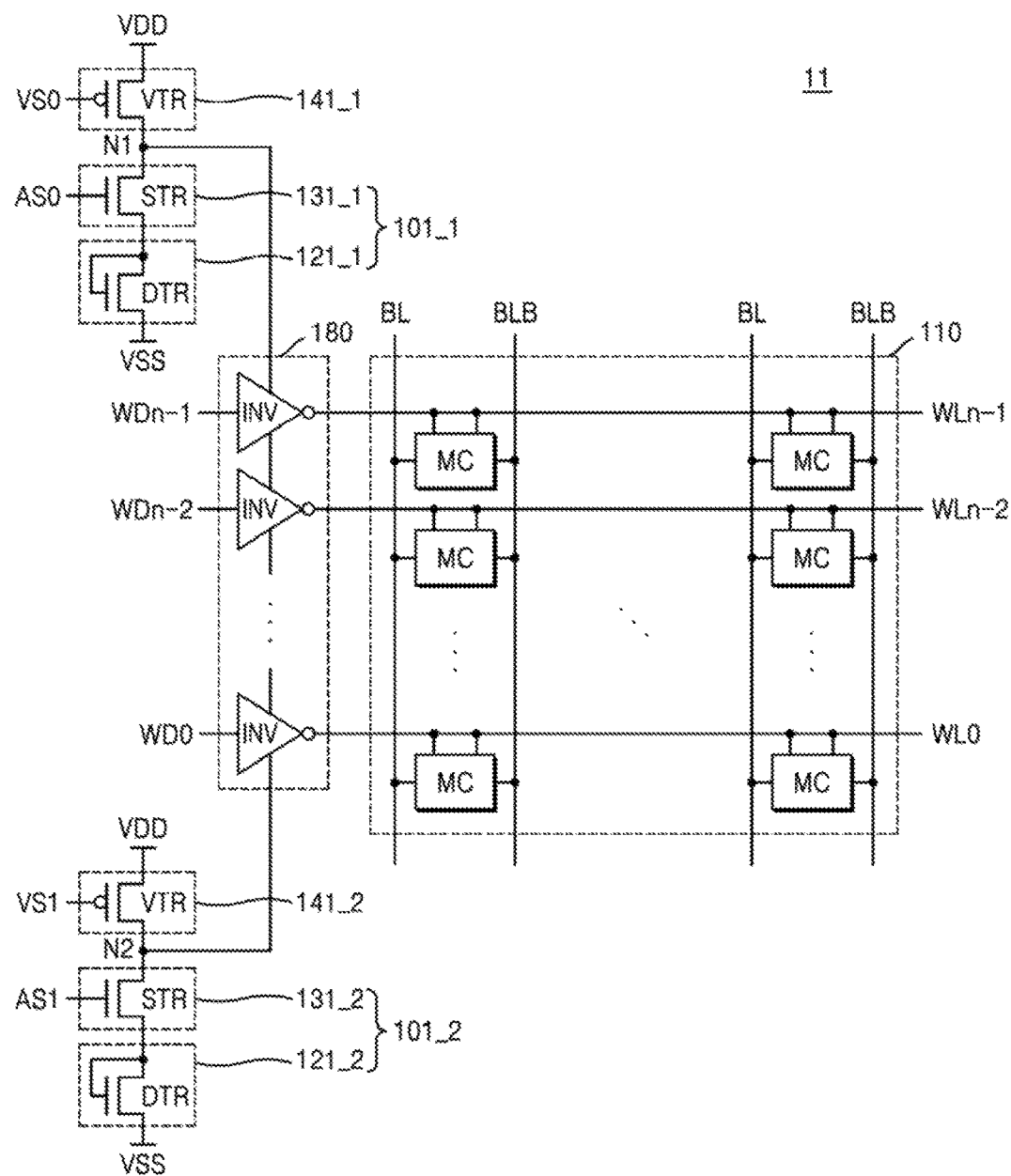
FIG. 3 is a circuit diagram illustrating a memory device according to an example embodiment of the inventive concept.

FIG. 3 is a circuit diagram illustrating a memory device, 11, according to an example embodiment of the inventive concept. Memory device 11 includes example configurations for circuit components with the same or like legends of FIG. 2. Referring to FIGS. 2 and 3, memory device 11 may include the memory cell array 110, a first voltage control circuit 101_1, a second voltage control circuit 101_2, a first power supply circuit 141_1, a second power supply circuit 141_2, and the word line driver 180. First and second voltage control circuits 101_1, 101_2 may collectively (or individually) form an example of voltage control circuit 100. First and second power supply circuits 141_1, 141_2 may collectively (or individually) form an example of power supply circuit 140. The first voltage control circuit 101_1 may include a first assist circuit 121_1 and a first assist switching circuit 131_1, and the second voltage control circuit 101_2 may include a second assist circuit 1212 and a second assist switching circuit 131_2. First and second assist circuits 121_1, 121_2 may collectively (or individually) form an example of assist circuit 120. First and second assist switching circuits 131_1, 131_2 may collectively (or individually) form an example of assist switching circuit 130.

The memory cell array 110 may include a plurality of memory cells MC connected to a plurality of word lines WL0 to WLn-1, a bit line BL, and a complementary bit line BLB. It should be understood that, although the plurality of memory cells MC are described herein as being memory cells of static random access memory (SRAM), the inventive concept is not limited thereto.

The first power supply circuit 141_1 and the first voltage control circuit 101_1 may be connected to an n-th word line WLn-1, which is an uppermost word line, and the second power supply circuit 141_2 and the second voltage control circuit 101_2 may be connected to a first word line WL0, which is a lowermost word line. However, the inventive concept is not limited thereto, and may be applied to embodiments in which each of the power supply circuits 141_1 and 141_2 and the voltage control circuits 101_1 and 101_2 is connected to two or more word lines. In addition, although FIG. 3 illustrates an embodiment in which there are two power supply circuits 141_1 and 141_2 and two voltage control circuits 101_1 and 101_2, alternative embodiments may utilize more or fewer than two power supply circuits and/or two voltage control circuits.

Each of the first power supply circuit 141_1 and the second power supply circuit 141_2 may include at least one voltage switching transistor (hereafter "VTR", interchangeably). The VTR is exemplified in FIG. 3 as a P-channel metal oxide semiconductor (PMOS) transistor, but may alternatively be implemented as an NMOS transistor. In addition, although each of the first power supply circuit 141_1 and the second power supply circuit 141_2 is shown in FIG. 3 as including one VTR, in alternative embodiments, each of the first and second power supply circuits 141_1, 141_2 may include a plurality of VTRs.

The power supply voltage VDD may be applied to one end of the VTR included in the first power supply circuit 141_1, the first node N1 may be connected to the other end thereof, and a first voltage switching signal VS0 may be applied to a gate thereof. (Herein, "one end" or "a first end" of a FET refers to a drain or source of the FET and "the other end" or "a second end" of the FET refers to the other one of the drain or source.) In addition, the power supply voltage VDD may be applied to one end of the VTR included in the second power supply circuit 141_2, a second node N2 may be connected to the other end thereof, and a second voltage switching signal VS1 may be applied to a gate thereof. The first power supply circuit 141_1 may apply the power supply voltage VDD to the first node N1 in response to the first voltage switching signal VS0. In addition, the second power supply circuit 141_2 may apply the power supply voltage VDD to the second node N2 in response to the second voltage switching signal VS1.

Each of the first assist circuit 121_1 and the second assist circuit 121_2 may include at least one diode NMOS transistor DTR (hereafter, just "DTR", as noted above). The DTR may refer to an NMOS transistor having a gate and one end (e.g., drain) connected to each other. Although each of the first assist circuit 121_1 and the second assist circuit 121_2 is shown in FIG. 3 as including one DTR, this is merely an example, and each of the first assist circuit 121_1 and the second assist circuit 121_2 may include a plurality of DTRs. According to the inventive concept, the DTR included in each of the first assist circuit 121_1 and the second assist circuit 121_2 may adaptively adjust a driving voltage level applied to the first node N1 or the second node N2 depending upon fast/slow cell characteristics of a memory cell MC and/or temperature, whereby the errors due to the read disturb phenomenon may be reduced or eliminated. As mentioned earlier, such adaptive adjustment may stem from inherent temperature-dependent and process-dependent performance characteristics of the DTR and/or from the use of static or dynamic control signals applied to one or more assist switching circuits connected in series with a DTR.

Each of the first assist switching circuit 131_1 and the second assist switching circuit 131_2 may include at least one switching transistor STIR. In one embodiment, the switching transistor STR may be an NMOS transistor. The first assist switching circuit 131_1 may receive a first assist switching signal AS0, and perform switching between the first node N1 and the first assist circuit 121_1 based thereon. In addition, the second assist switching circuit 131_2 may receive a second assist switching signal AS1, and perform switching between the second node N2 and the second assist circuit 121_2 based thereon.

The word line driver 180 may include a plurality of inverters INV respectively connected to the plurality of word lines WL0 to WLn-1. The plurality of inverters INV may apply the word line driving voltage of the first node N1 or the second node N2 to the plurality of word lines WL0 to WLn-1 in response to word line driving signals WD0 to WDn-1, respectively. Although FIG. 3 illustrates an embodiment in which one inverter INV is connected to each of the plurality of word lines WL0 to WLn-1, two or more inverters INV may be connected to each word line in alternate embodiments.

Figure 4A:
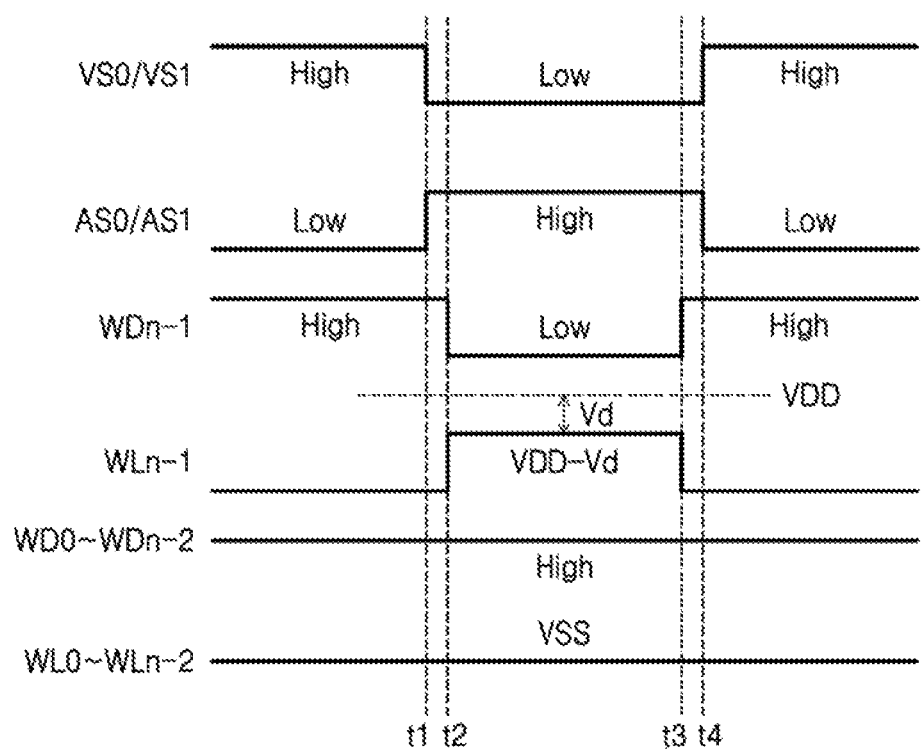
FIG. 4A is a timing diagram illustrating an operation of a memory device according to an example embodiment of the inventive concept.

FIG. 4A is a timing diagram illustrating a method of operating a memory device according to an example embodiment of the inventive concept. Specifically, FIG. 4A is a diagram illustrating an embodiment in which the n-th word line WLn-1 of FIG. 3 is driven. In this example, the word line voltage for any given word line (e.g., the n-th word line WLn-1) is derived from both power supply circuits 141_1 and 141_2 of FIG. 3.

Referring to FIGS. 3 and 4A, at a first time point t1, each of the first voltage switching signal VS0 and the second voltage switching signal VS1 may be transitioned from logic High to logic Low. Thus, the voltage switching transistor VTR included in each of the power supply circuits 141_1 and 141_2 may be turned on, and the power supply voltage VDD may be applied to the first node N1 and the second node N2. In addition, each of the first assist switching signal AS0 and the second assist switching signal AS1 may be transitioned from logic Low to logic High. Thus, the switching transistor STR included in each of the switching circuits 131_1 and 131_2 may be turned on, and the power supply voltage VDD applied to the first node N1 and the second node N2 may be applied to the gate of the diode NMOS transistor DTR, whereby the diode NMOS transistor DTR may be turned on. As a result, a voltage drop may occur for the word line driving voltage of each of the first node N1 and the second node N2.

At a second time point t2, an n-th word line driving signal WDn-1 may be transitioned from logic High to logic Low. Thus, an inverter INV connected to the n-th word line WLn-1 may apply the word line driving voltage to the nth word line WLn-1, whereby the n-th word line WLn-1 may be driven. Here, the nth word line WLn-1 may have a voltage level of "VDD-Vd", which is reduced from the power supply voltage VDD by a voltage drop level Vd. Here, the voltage drop level Vd may adaptively vary depending upon cell characteristics of the memory cell MC or a temperature, due to characteristics of the diode NMOS transistor DTR. Specifically, the voltage drop level Vd may be proportional to the temperature, and also be proportional to fast cell characteristics of the NMOS transistor included in the memory cell MC. Thus, the word line driving voltage may be inversely correlated with the temperature, and also be inversely correlated with the fast cell characteristics.

At a third time point t3 after a read or write operation for the memory cell MC connected to the nth word line WLn-1 is ended, the nth word line driving signal WDn-1 may be transitioned from logic Low to logic High. Thus, the nth word line WLn-1 may be transitioned to logic low (for example, a ground voltage).

At a fourth time point t4, each of the first voltage switching signal VS0 and the second voltage switching signal VS1 may be transitioned from logic Low to logic High. Thus, the voltage switching transistor VTR included in each of the power supply circuits 141_1 and 141_2 may be turned off. In addition, each of the first assist switching signal AS0 and the second assist switching signal AS1 may be transitioned from logic High to logic Low. Thus, the switching transistor STR included in each of the switching circuits 131_1 and 131_2, and the diode NMOS transistor DTR may be turned off.

While the above process, in which the word line driving voltage is applied with respect to the n-th word line WLn-1, is performed, first to n-1-th word line driving signals WD0 to WDn-2 may be maintained at logic High. Thus, first to n-1-th word lines WL0 to WLn-2, which do not correspond to read or write targets, may not be driven and may be maintained at the ground voltage VSS.

Although FIG. 4A illustrates an embodiment in which the n-th word line WLn-1 is driven, this is merely an example, and of course, the inventive concept may also be applied to the other word lines WL0 to WLn-2.

Figure 4B:
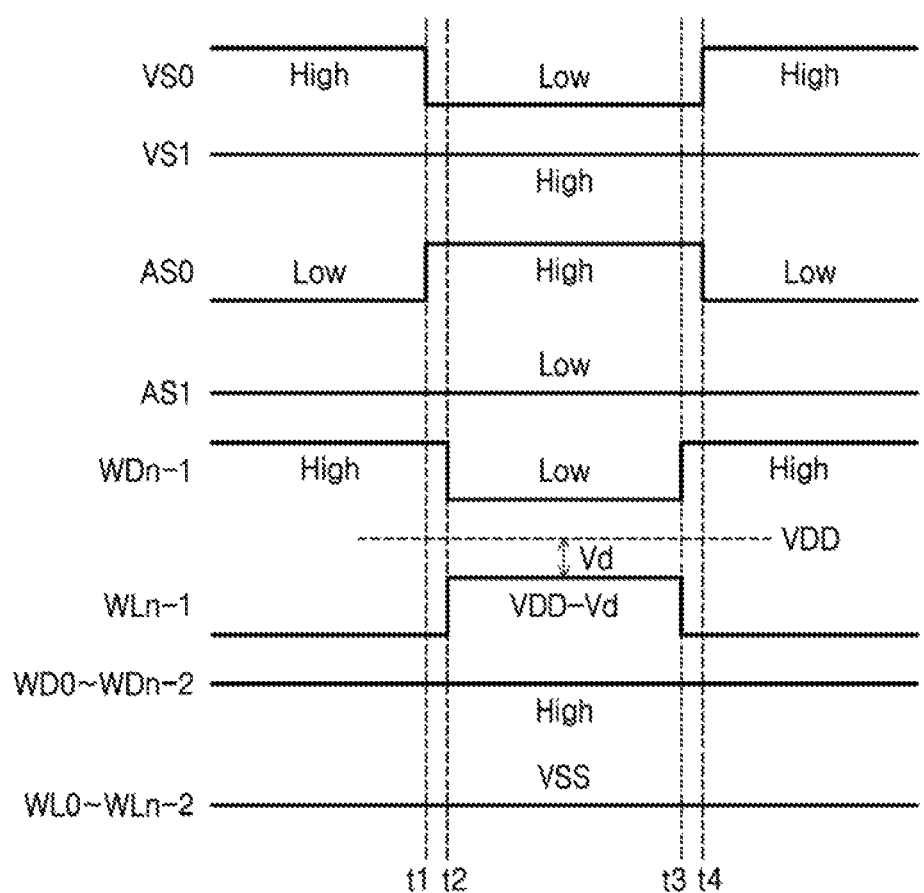
FIG. 4B is a tinting diagram illustrating an operation of a memory device according to an example embodiment of the inventive concept.

FIG. 4B is a tuning diagram illustrating a method of operating a memory device according to an example embodiment of the inventive concept. In this example, the word line voltage for a given word line is derived from only one of the power supply circuits 141_1 and 141_2 of FIG. 3. Descriptions identical to those made with reference to FIG. 4A will be omitted.

Referring to FIGS. 3 and 4B, FIG. 4B may illustrates an embodiment in which only the first power supply circuit 141_1 and the first voltage control circuit 101_1 are operated to drive the n-th word line WLn-1. At the first time point t1, as the first voltage switching signal VS0 is transitioned from logic High to logic Low, the voltage switching transistor VTR included in the power supply circuit 141_1 may be turned on, and the power supply voltage VDD may be applied to the first node N1. In addition, as the first voltage switching signal VS0 is transitioned from logic Low to logic High, the switching transistor STR included in the switching circuit 131_1 may be turned on, and the power supply voltage VDD applied to the first node N1 may be applied to the gate of the diode NMOS transistor DTR, whereby the diode NMOS transistor DTR may be turned on. As a result, a voltage drop may occur for the word line driving voltage of the first node N1.

At the second time point t2, the n-th word line driving signal WDn-1 may be transitioned from logic High to logic Low. Thus, the inverter INV connected to the north word line WLn-1 may apply the word line driving voltage to the nth word line WLn-1, whereby the n-th word line WLn-1 may be driven. Here, the nth word line WLn-1 may have a voltage level of VDD-Vd, which is reduced from the power supply voltage VDD by the voltage drop level Vd. Typically, Vd is at least one order of magnitude less than VDD. It should be noted that "Vd" is not to be understood as a diode-type voltage drop across effective anode to cathode terminals of the DTR (i.e., Vd does not refer to the drain to source voltage drop $V_{DS}$ of the DTR).

At the third time point t3 after a read or write operation for the memory cell MC connected to the nth word line WLn-1 is ended, the n-th word line driving signal WDn-1 may be transitioned from logic Low to logic High. Thus, the n-th word line WLn-1 may be transitioned to a logic low level (for example, a ground voltage level).

At the fourth time point t4, the first voltage switching signal VS0 may be transitioned from logic Low to logic High. Thus, the voltage switching transistor VTR included in the power supply circuit 141_1 may be turned off. In addition, the first assist switching signal AS0 may be transitioned from logic High to logic Low. Thus, the switching transistor STR included in the switching circuit 131_1, and the diode NMOS transistor DTR may be turned off.

While the above process, in which the word line driving voltage is applied with respect to the nth word line WLn-1, is performed, the first to n-1-th word line driving signals WD0 to WDn-2 may be maintained at logic High. Thus, the first to n-1-th word lines WL0 to WLn-2, which do not correspond to read or write targets, may not be driven and may be maintained at the ground voltage VSS.

In the example of FIG. 4B, the word line driving voltage of a given word line, e.g., the n-th word line WLn-1, is derived from a single power supply circuit, e.g., 141_1, rather than from both the first and second power supply circuits 141_1, 141_2 as in the case of FIG. 4A. In this case, the power supply circuit that is not to be used to drive a particular word line may be disabled by supplying a logic high to the VTR gate and a logic low to the STR gate. For instance, the second voltage switching signal VS1 may be maintained at logic High, and the second assist switching signal AS1 may be maintained at logic Low in the example of FIG. 4B. Thus, the second power supply circuit 141_2 and the second voltage control circuit 101_2 may not be operated, and only the first power supply circuit 141_1 and the first voltage control circuit 101_1 may be operated. On the other hand, to drive a word line like the first word line WL0 located closer to the second power supply circuit 141_2 and the second voltage control circuit 101_2, the first power supply circuit 141_1 and the first voltage control circuit 101_1 may not be operated, and only the second power supply circuit 141_2 and the second voltage control circuit 101_2 may be operated.

Figure 5:
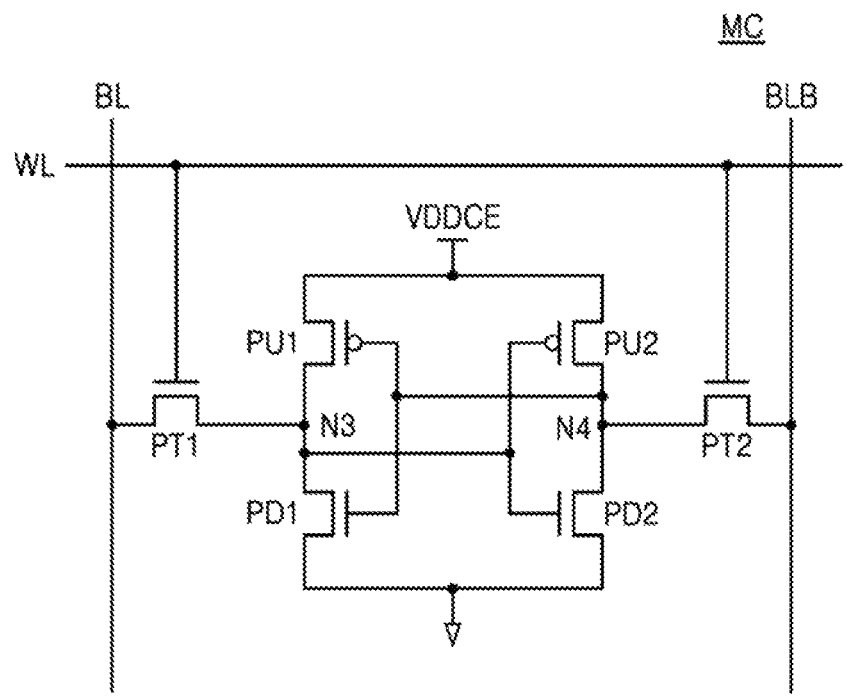
FIG. 5 is a circuit diagram illustrating a memory cell according to an example embodiment of the inventive concept.

FIG. 5 is a circuit diagram illustrating a memory cell according to an example embodiment of the inventive concept. The memory cell MC of FIG. 5 may be a unit SRAM cell. The memory cell MC may include a plurality of transistors connected to a pair of bit lines BL and BLB or the word line WL. The plurality of transistors may include a pair of transmission transistors PT1 and PT2, a pair of pull-up transistors PU1 and PU2, and a pair of pull-down transistors PD1 and PD2. Each of first and second pull-up transistors PU1 and PU2 may be a PMOS transistor, and each of first and second pull-down transistors PD1 and PD2 and first and second transmission transistors PT1 and PT2 may be an NMOS transistor.

Gates of the first and second transmission transistors PT1 and PT2 may be connected to the word line WL, and drains of the first and second transmission transistors PT1 and PT2 may be respectively connected to the pair of bit lines BL and BLB. Sources of the first and second pull-up transistors PU1 and PU2 may be connected to receive a cell power supply voltage VDDCE, and sources of the first and second pull-down transistors PD1 and PD2 may be connected to a ground line GND. A source of the first transmission transistor PT1, a drain of the first pull-up transistor PU1, and a drain of the first pull-down transistor PD1 may be connected to the first node N3 in common. A source of the second transmission transistor PT2, a drain of the second pull-up transistor PU2, and a drain of the second pull-down transistor PD2 may be connected to the second node N4 in common. A gate of the first pull-up transistor PU1 and a gate of the first pull-down transistor PD1 may be connected to the second node N4 in common and thus constitute a first latch. A gate of the second pull-up transistor PU2 and a gate of the second pull-down transistor PD2 may be connected to the first node N3 in common and has constitute a second latch.

If the first node N3 is at a high level, the second pull-up transistor PU2 is turned off, and the second pull-down transistor PD2 is turned on, whereby the second node N4 may be transitioned to a low level. As the second node N4 is transitioned to the low level, the first pull-up transistor PU1 is turned on, and the first pull-down transistor PD1 is turned off, whereby the first node N3 may be maintained at the high level.

If the second node N4 is at the high level, the first pull-up transistor PU1 is turned off, and the first pull-down transistor PD1 is turned on, whereby the first node N3 may be transitioned to the low level. As the first node N3 is transitioned to the low level, the second pull-up transistor PU2 is turned on, and the second pull-down transistor PD2 is turned off, whereby the second node N4 may be maintained at the high level.

Therefore, if the first and second transmission transistors PT1 and PT2 are turned on based on a gate driving signal applied to the word line WL, data signals provided to the bit lines BL and BLB may be latched onto the first and second nodes N3 and N4 through the first and second transmission transistors PT1 and PT2. If the first and second transmission transistors PT1 and PT2 are turned on, data latched onto the first and second nodes N3 and N4 may be provided to the bit lines BL and BLB through the first and second transmission transistors PT1 and PT2. Therefore, the signals provided to the bit lines BL and BLB may be sensed by a sense amplifier (not shown), whereby the data latched onto the first and second nodes N3 and N4 may be read.

The cell power supply voltage VDDCE may approximately equal the main power supply voltage VDD. In some conventional memory devices, the word line WL voltage also approximately equals VDDCE during read/write to the memory cell MC, which is a cause of the read disturb phenomenon. The inventive concept reduces or eliminates the read disturb phenomenon by reducing the word line voltage below VDDCE (e.g. to "VDD-Vd" described above) during at least a portion of a read interval. In addition, a target word line voltage according to the inventive concept may be temperature-dependent.

Figure 6:
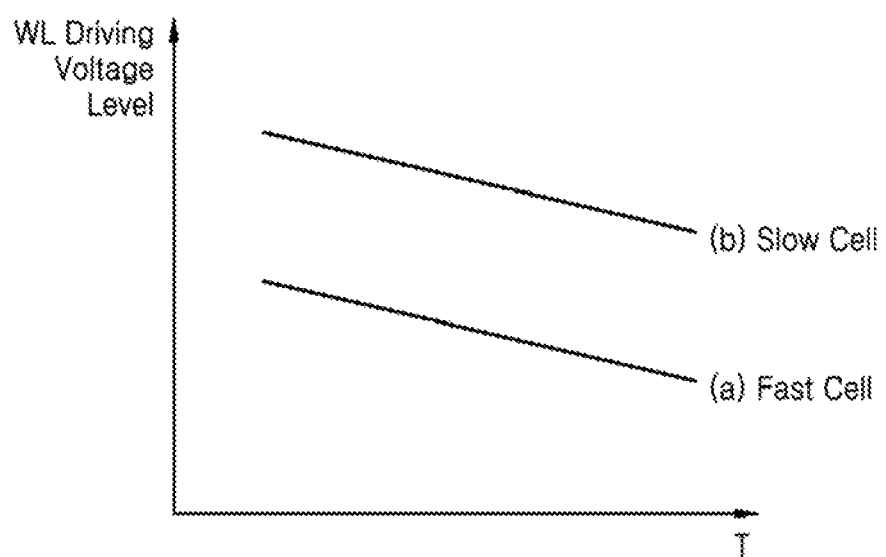
FIG. 6 is a graph depicting a level of a word line driving voltage of a memory device according to an example embodiment of the inventive concept.

FIG. 6 is a graph depicting a level of a word line driving voltage of a memory device according to an example embodiment of the inventive concept. In FIG. 6, graph (a) may show a correlation between a level of a word line driving voltage and temperature when an NMOS transistor (for example, the first and second pull-down transistors PD1 and PD2 of FIG. 5) included in a memory cell connected to an assist circuit has fast characteristics (with a relatively low threshold voltage). Graph (b) may show a correlation between the level of the word line driving voltage and the temperature when the NMOS transistor included in the memory cell connected to the assist circuit has slow characteristics (with relatively high threshold voltage).

The higher the temperature is, the greater a voltage drop of the assist circuit with respect to the word line driving voltage may be. That is, when the DTR included in the assist circuit is operated as a pull-down transistor, a voltage drop level by a pull down operation may be proportional to the temperature. Thus, the word line driving voltage may be inversely proportional to the temperature. These characteristics may be exhibited in both of the case of a fast cell (graph (a)) and the case of a slow cell (graph (b)). Thus, according to the inventive concept, the word line driving voltage provided at the word line WL may be intentionally provided as a decreasing function of temperature, which may result in a reduction or elimination of read disturb errors over a requisite range of temperatures.

When comparing the graph (a) with the graph (b), the voltage drop level may be higher in the case that the memory cell connected to the assist circuit has fast characteristics than in the case that the memory cell has slow characteristics. Since the memory cell has fast characteristics when a threshold voltage of the NMOS transistor included in the memory cell is relatively low, the voltage drop level of the assist circuit may be higher as the threshold voltage of the NMOS transistor included in the memory cell is lower. Thus, the word line driving voltage may be lower in the case of the fast cell (graph (a)) than in the case of the slow cell (graph (b)). Thus, according to the inventive concept, at a given temperature within a desired operating temperature range, the assist circuit may be configured to reduce the WL driving voltage from the main power supply level VDD to a first level when an MC cell transistor has a first threshold voltage. The assist circuit may reduce the WL driving voltage to a second, lower level when the MC cell transistor has a second threshold voltage, where the first threshold voltage is higher than the second threshold voltage. This may ensure that the read disturb phenomenon is alleviated even when threshold voltages within MC cells vary over a range of values.

Thus, an assist circuit according to the inventive concept may control a level of the word line driving voltage by reducing a level of the power supply voltage at the first node based on characteristics of the DTR, where the assist circuit adjusts the level of the word line driving voltage depending upon at least one of a threshold voltage of one or more transistors within the memory cell, and/or temperature.

Figure 7:
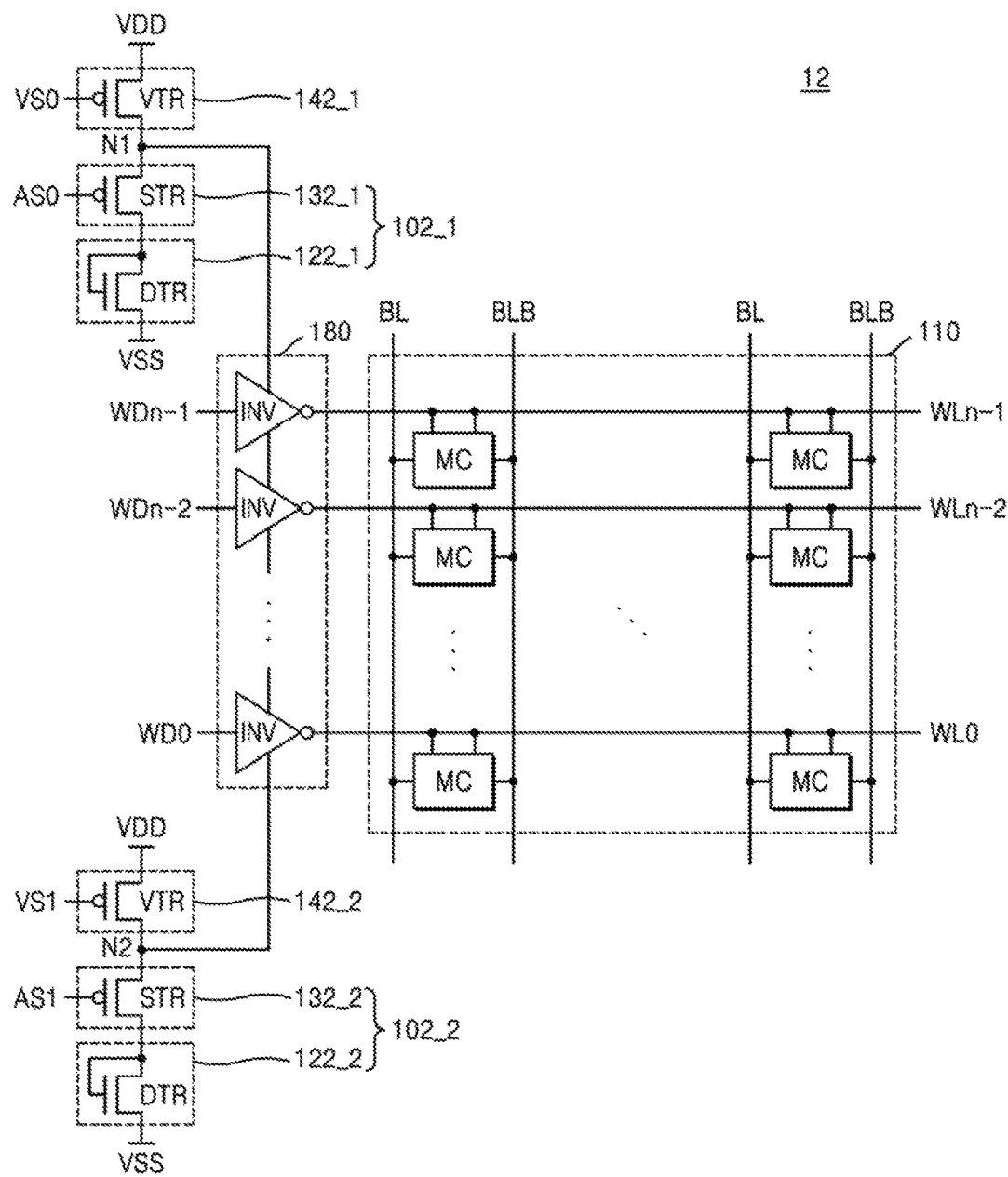
FIG. 7 is a circuit diagram illustrating a memory device according to an example embodiment of the inventive concept.

FIG. 7 is a circuit diagram illustrating a memory device according to an example embodiment of the inventive concept. FIG. 7 may illustrate an embodiment in which each of a first assist switching circuit 132_1 and a second assist switching circuit 132_2 include a PMOS transistor, unlike in the embodiment of FIG. 3. Since other details except the above distinction may be the same as in the embodiment of FIG. 3, redundant descriptions thereof will be omitted.

Referring to FIGS. 2 and 7, a memory device 12 may include the memory cell array 110, a first voltage control circuit 102_1, a second voltage control circuit 102_2, a first power supply circuit 142_1, a second power supply circuit 142_2, and the word line driver 180. The first voltage control circuit 102_1 may include a first assist circuit 122_1 and a first assist switching circuit 132_1, and the second voltage control circuit 102_2 may include a second assist circuit 122_2 and a second assist switching circuit 132_2.

The first assist switching circuit 132_1 may include the switching transistor STR configured as a PMOS transistor, and may perform switching between the first assist circuit 122_1 and the first node N1 in response to the first assist switching signal AS0. In addition, the second assist switching circuit 132_2 may include the switching transistor STR configured as a PMOS transistor, and may perform switching between the second assist circuit 1222 and the second node N2 in response to the second assist switching signal AS1. Each of the first assist switching signal AS0 and the second assist switching signal AS1 may be transitioned to logic low when the word line is driven, unlike in FIG. 3. In addition, in one embodiment, as the first assist switching signal AS0 and the first voltage switching signal VS0, an identical signal may be applied to the first assist switching circuit 132_1 and the first power supply circuit 142_1, and as the second assist switching signal AS1 and the second voltage switching signal VS1, an identical signal may be applied to the second assist switching circuit 132_2 and the second power supply circuit 142_2.

Figure 8:
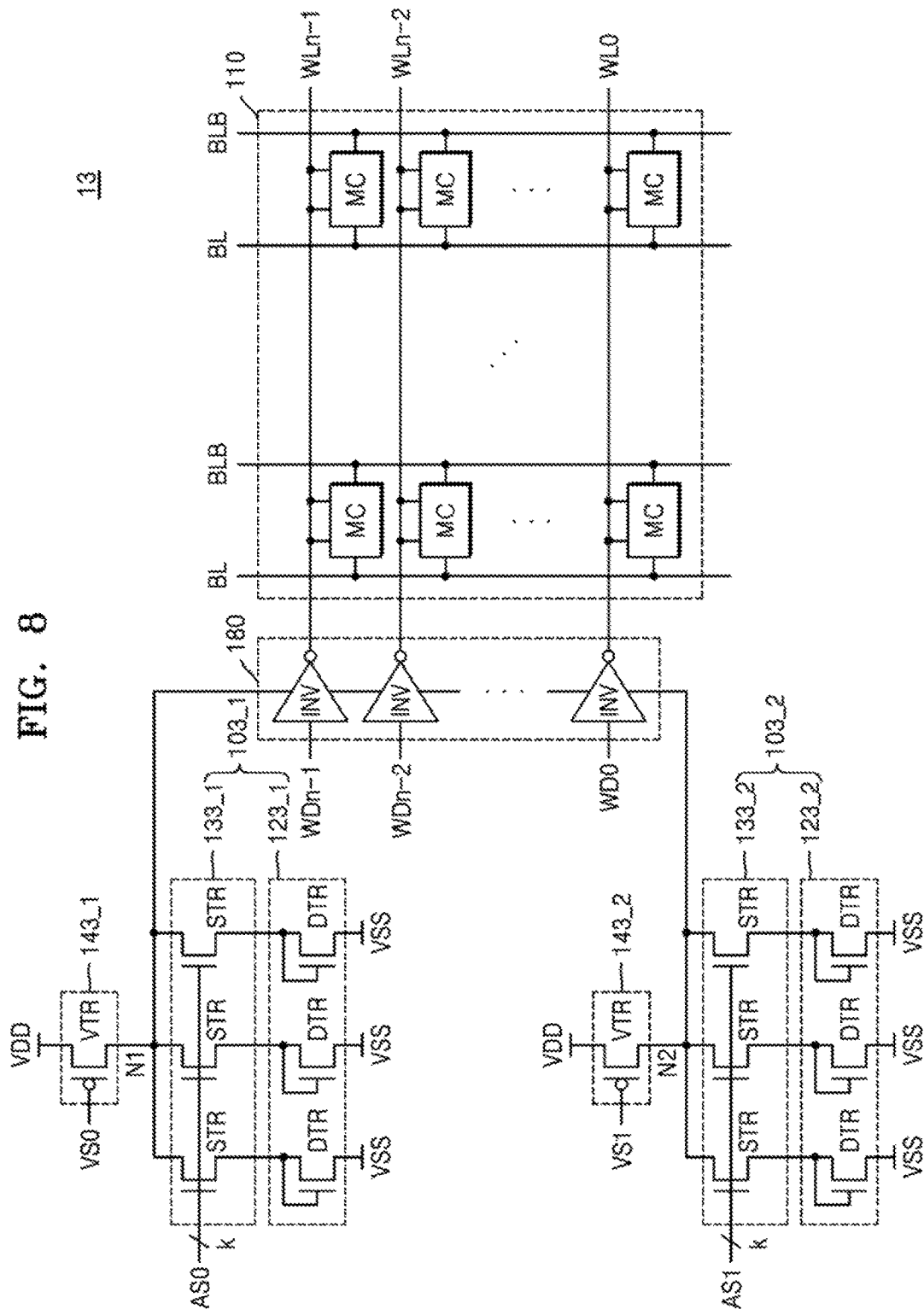
FIG. 8 is a circuit diagram illustrating a memory device according to an example embodiment of the inventive concept.

FIG. 8 is a circuit diagram illustrating a memory device, 13, according to an example embodiment of the inventive concept. Descriptions identical to those made with reference to FIG. 3 will be omitted. Memory device 13 may include the memory cell array 110, a first voltage control circuit 103_1, a second voltage control circuit 103_2, a first power supply circuit 143_1, a second power supply circuit 143_2, and the word line driver 180. The first voltage control circuit 103_1 may include a first assist circuit 123_1 and a first assist switching circuit 133_1, and the second voltage control circuit 103_2 may include a second assist circuit 123_2 and a second assist switching circuit 133_2.

Since the memory cell array 110, the first power supply circuit 143_1, the second power supply circuit 143_2, and the word line driver 180 may be identical or similar to the memory cell array 110, the first power supply circuit 141_1, the second power supply circuit 141_2, and the word line driver 180 of FIG. 3, respectively, descriptions thereof will be omitted.

Each of the first assist circuit 123_1 and the second assist circuit 123_2 may include a plurality of DTRs. Although 8 illustrates an embodiment in which the gate and the one end of the DTR are directly connected to each other, in an alternate embodiment, the gate of the DTR may be connected to the first node N1 or the second node N2, and thus be connected to the one end of the DTR by switching by the first assist switching circuit 133_1 or the second assist switching circuit 133_2.

Each of the first assist switching circuit 133_1 and the second assist switching circuit 133_2 may include a plurality of switching transistors STR. The first assist switching circuit 133_1 may receive the first assist switching signal AS0 and perform switching between the first node N1 and each of the DTRs of the first assist circuit 123_1 based thereon. The second assist switching circuit 133_2 may receive the second assist switching signal AS1 and perform switching between the second node N2 and each of the DTRs of the second assist circuit 123_2 based thereon.

In one embodiment, each of the first assist switching signal AS0 and the second assist switching signal AS1 may include information on a degree of voltage control. The first assist switching circuit 133_1 may selectively turn on the plurality of switching transistors STR based on the first assist switching signal AS0. For example, each of the first and second assist switching signals AS0, AS1 may be provided across an integer "k" lines. In the case where three switching transistors STR are provided (as in FIG. 8), an example may be k=2, so that first and second lines together carry the assist switching signal AS0 or AS1 as a binary signal. The first line may be connected to the gates of two switching transistors STR while the second line may be connected to the gate of only the remaining one of the three switching transistors STR. Hence, when the first assist switching signal AS0 is "00", the first assist switching circuit 133_1 may turn off all of the plurality of switching transistors STR. When the first assist switching signal AS0 is "01", where the "0" is applied to the first line and the "1" is applied to the second line, the first assist switching circuit 133_1 may turn on one of the plurality of switching transistors STR (i.e., the transistor with its gate connected to the second line). Similarly, when the first assist switching signal AS0 is "10", the first assist switching circuit 133_1 may turn on two of the plurality of switching transistors STR (with gates connected to the first line which receives the "1"), and when the first assist switching signal AS0 is "11", the first assist switching circuit 133_1 may turn on all of the plurality of switching transistors STR.

The first assist switching circuit 133_1 selectively turns on the switching transistors STR based on the first assist switching signal AS0, whereby the number of turned-on switching transistors STR connected to the first node N1 may vary, and which of the switching transistors STR is turned on may be changed. The DTRs may have different voltage drop capabilities depending upon sizes thereof or the like. The degree of voltage drop of the word line driving voltage of the first node N1 may be adjusted by changing the number and/or types of the DTRs connected to the first node N1. Since the second assist switching circuit 133_2 may also be operated in an identical or similar manner to the first assist switching circuit 133_1, descriptions thereof will be omitted.

Although FIG. 8 illustrates an embodiment in which the number of the plurality of switching transistors STR included in each of the first assist switching circuit 133_1 and the second assist switching circuit 133_2 is three, and in which the number of the DTRs included in each of the first assist circuit 123_1 and the second assist circuit 123_2 is three, this is merely an example. In other embodiments, more or fewer than three DTRs and three assist switching circuits may be provided.

Figure 9:
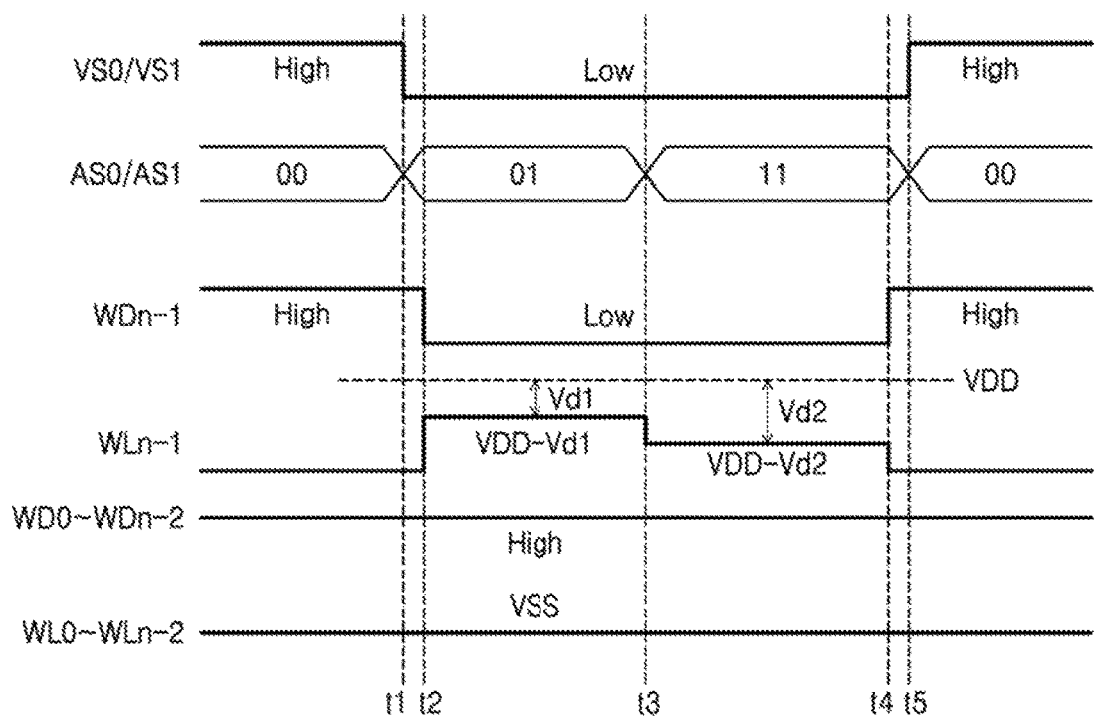
FIG. 9 is a timing diagram illustrating an operation of a memory device according to an example embodiment of the inventive concept.

FIG. 9 is a timing diagram illustrating an operation of a memory device, e.g., the memory device 13 of FIG. 8, according to an example embodiment of the inventive concept. In this example, at least one of the first and second voltage control circuits 103_1, 103_2 is adaptively controlled so that a "stepped" word line voltage is provided during a word line read/write interval. Descriptions identical to those made with reference to FIG. 4A will be omitted.

Referring to FIGS. 8 and 9, at the time point t1, each of the first voltage switching signal VS0 and the second voltage switching signal VS1 may be transitioned from logic High to logic Low. In addition, each of the first assist switching signal AS0 and the second assist switching signal AS1 may be transitioned from "00" to "01". In this example, when the first assist switching signal AS0 is "00", the first assist switching circuit 133_1 may turn off all of the plurality of switching transistors STR, and when the first assist switching signal AS0 is "01", the first assist switching circuit 133_1 may turn on one of the plurality of switching transistors STR. In addition, when the first assist switching signal AS0 is "10", the first assist switching circuit 133_1 may turn on two of the plurality of switching transistors STR, and when the first assist switching signal AS0 is "11", the first assist switching circuit 133_1 may turn on all of the plurality of switching transistors STR. The second assist switching circuit 133_2 may also be operated like the first assist switching circuit 133_1, based on the second assist switching signal AS1.

Therefore, before the first time point t1 at which "00" is applied as the first assist switching signal AS0 and the second assist switching signal AS1, all of the switching transistors STR included in the first assist switching circuit 133_1 and the second assist switching circuit 133_2 may be turned off. However, as each of the first assist switching signal AS0 and the second assist switching signal AS1 is transitioned to "01" at the first time point t1, each of the first assist switching circuit 133_1 and the second assist switching circuit 133_2 may turn on one switching transistor STR, and one diode NMOS transistor DTR may be connected to each of the first node N1 and the second node N2.

At the time point t2, the n-th word line driving signal WDn-1 may be transitioned from logic High to logic Low. Thus, the inverter INV connected to the n-th word line WLn-1 may apply the word line driving voltage to the n-th word line WLn-1, whereby the n-th word line WLn-1 may be driven. Here, the n-th word line WLn-1 may have a voltage level of "VDD-Vd1", which is reduced from the power supply voltage VDD by a first voltage drop level Vd1. Here, the first voltage drop level Vd1 may be a voltage level reduced due to the turning on of one DTR included in each of the first assist switching circuit 133_1 and the second assist switching circuit 133_2.

At the third time point t3, each of the first assist switching signal AS0 and the second assist switching signal AS1 may be transitioned from "01" to "11". In one embodiment, since the memory device 13 may need to reduce the word line driving voltage for a read margin at the third time point t3, each of the first assist switching signal AS0 and the second assist switching signal AS1 may be transitioned from "01" to "11". As a result of transition, each of the first assist switching circuit 133_1 and the second assist switching circuit 133_2 may turn on all of the switching transistors SI R, and three DTRs may be connected to each of the first node N1 and the second node N2. Here, the nth word line WLn-1 may have a voltage level of "VDD-Vd2", which is reduced from the power supply voltage VDD by a second voltage drop level Vd2. Here, the second voltage drop level Vd2 may be a voltage level reduced due to the turning on of all of the DTRs included in each of the first assist switching circuit 133_1 and the second assist switching circuit 133_2. The voltage drop level may vary depending upon the number, sizes and the like of the DTRs connected to each of the first node N1 and second node N2. In the present embodiment, since there may occur a greater voltage drop as the three DTRs are connected to each of the first node N1 and second node N2 at the third time point t3, the second voltage drop level Vd2 may be greater than the first voltage drop level Vd1. Thus, a stepped word line voltage is provided during a word line read interval between times t2 and t4, where the word line voltage changes in a step from "VDD-Vd1" to "VDD-Vd2". By causing the word line voltage to step down in this manner, read/write errors due to the read disturb phenomenon may be reduced even further for some memory configurations.

At the fourth time point t4 after a read or write operation for the memory cell MC connected to the n-th word line WLn-1 is ended, the n-th word line driving signal WDn-1 may be transitioned from logic Low to logic High. Each of the first assist switching signal AS0 and the second assist switching signal AS1 may be transitioned from logic High to logic Low. Thus, a voltage level of the nth word line WLn-1 may be transitioned to logic low (for example, a ground voltage).

In addition, at a fifth time point t5, each of the first voltage switching signal VS0 and the second voltage switching signal VS1 may be transitioned from logic Low to logic High, and each of the first assist switching signal AS0 and the second assist switching signal AS1 may be transitioned from "11" to "00". Thus, the voltage switching transistor VTR included in each of the power supply circuits 143_1 and 143_2 may be turned off, and the plurality of switching transistors included in each of the assist switching circuits 133_1 and 133_2 may be turned off.

While the above process, in which the word line driving voltage is applied with respect to the n-th word line WLn-1, is performed, the first to n-1-th word line driving signals WD0 to WDn-2 may be maintained at logic High. Thus, the first to n-1-th word lines WL0 to WL,n-2, which do not correspond to read or write targets, may not be driven and may be maintained at the logic low (for example, the ground voltage).

Figure 10:
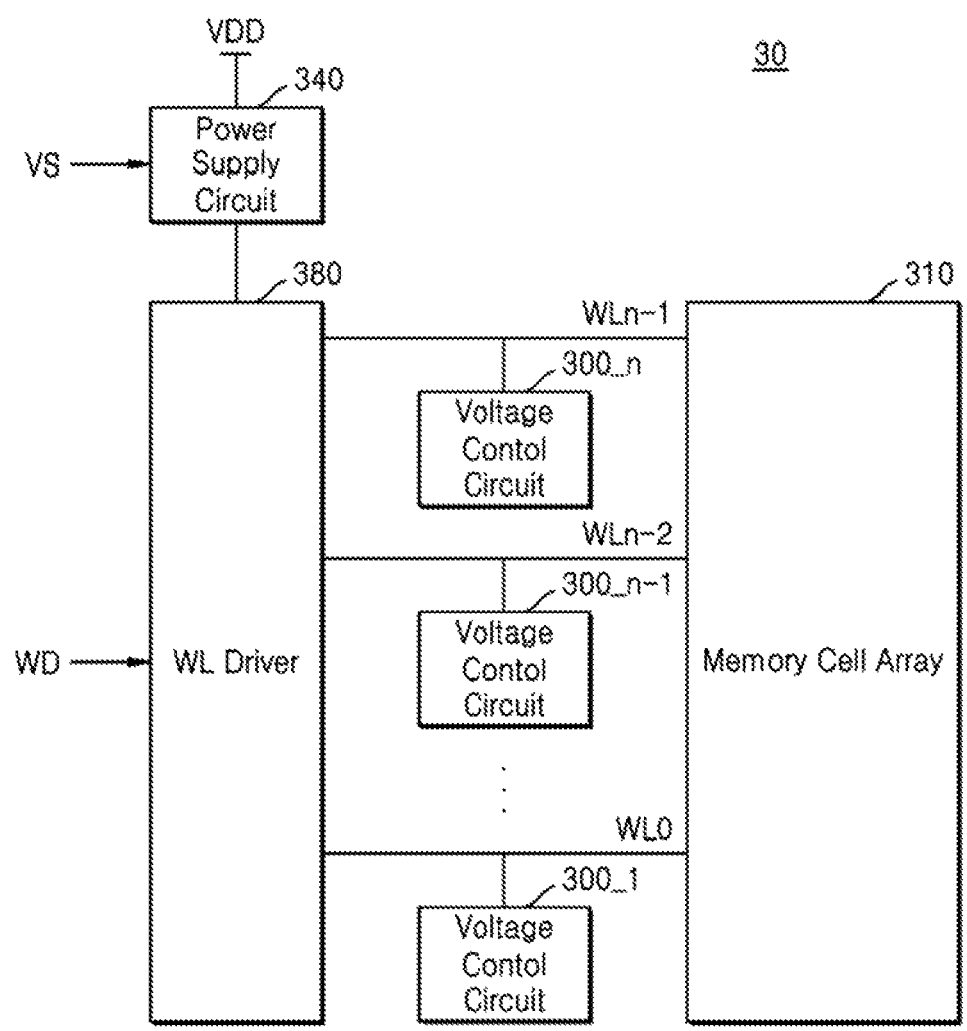
FIG. 10 is a block diagram illustrating a memory device according to an example embodiment of the inventive concept.

FIG. 10 is a block diagram illustrating a memory device according to an example embodiment of the inventive concept. Descriptions identical to those made with reference to FIG. 2 will be omitted.

Referring to FIG. 10, a memory device 30 may include first to n-th voltage control circuits 300_1 to 300_n, a memory cell array 310, a power supply circuit 340, and a word line driver 380. Since the memory cell array 310, the power supply circuit 340, and the word line driver 380 may be substantially identical or similar to the memory cell array 110, the power supply circuit 140, and the word line driver 180 of FIG. 2, respectively, descriptions thereof will be omitted.

The first to n-th voltage control circuits 300_1 to 300_n may be respectively connected to the first to n-th word lines WL0 to WLn-1. The first to n-th voltage control circuits 700_1 to 300_n may respectively adjust driving voltage levels of the first to n-th word lines WL0 to WLn-1. In one embodiment, each of the first to n-th voltage control circuits 300_1 to 300_n may include an assist circuit including at least one diode NMOS transistor, and an assist switching circuit performing switching between the assist circuit and each of the first to n-th word lines WL0 to WLn-1.

Figure 11A:
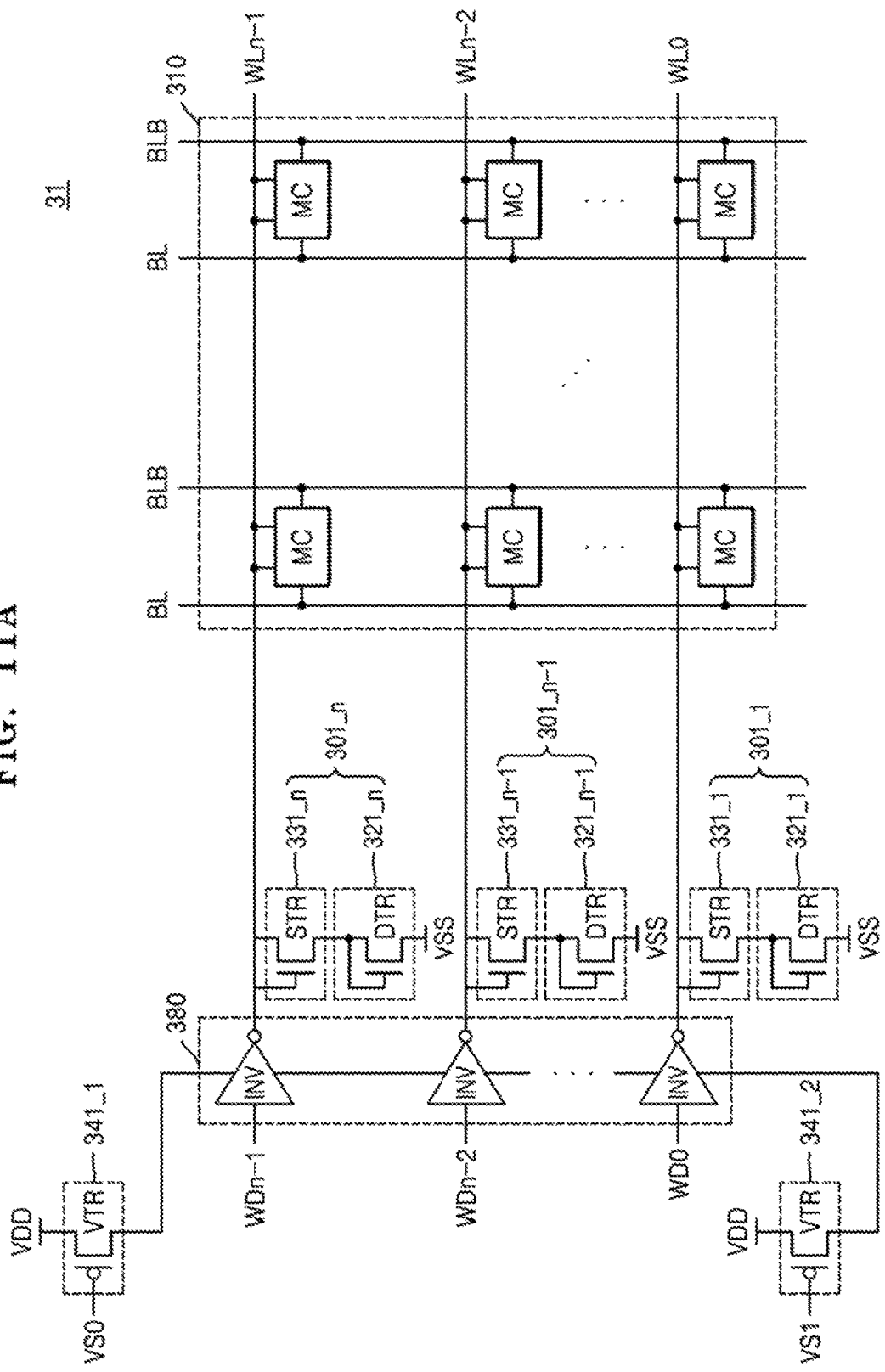
FIG. 11A is a circuit diagram illustrating a memory device according to an example embodiment of the inventive concept.

FIG. 11A is a circuit diagram illustrating a memory device according to an example embodiment of the inventive concept. Descriptions identical to those made with reference to FIG. 3 will be omitted.

Referring to FIGS. 10 and 11A, a memory device 31 may include the memory cell array 310, first to n-th voltage control circuits 301_1 to 301_n, a first power supply circuit 341_1, a second power supply circuit 341_2, and the word line driver 380. The first to n-th voltage control circuits 301_1 to 301_n may respectively include first to n-th assist circuits 321_1 to 321_2 1, and also respectively include first to n-th assist switching circuits 331_1 to 331_n.

The memory cell array 310 and the word line driver 380 shown in FIG. 11A may respectively correspond to detailed circuit diagrams of the memory cell array 310 and the word line driver 380 of FIG. 10, and the first to n-th voltage control circuits 301_1 to 301_p may respectively correspond to embodiments of detailed circuit diagrams of the first to nth voltage control circuits 300_1 to 300_n of FIG. 10. In addition, each of the first power supply circuit 341_1 and the second power supply circuit 341_2 may correspond to an embodiment of a detailed circuit diagram of the power supply circuit 340 of FIG. 10. Since the memory cell array 310, the word line driver 380, the first power supply circuit 341_1, and the second power supply circuit 341_2 may be identical or similar to the memory cell array 110, the word line driver 180, the first power supply circuit 141_1, and the second power supply circuit 141_2 of FIG. 3, respectively, descriptions thereof will be omitted.

Each of the first to n-th assist circuits 321_1 to 321_n may include at least one DTR. Although each of the first to n-th assist circuits 321_1 to 321_n is shown in FIG. 11A as including one DTR, this is merely an example, and each of the first to n-th assist circuits 321_1 to 321_n may include a plurality of DTRs.

Each of the first to n-th assist switching circuits 331_1 to 331_n may include at least one switching transistor STR. In one embodiment, the switching transistor STR may be an NMOS transistor. In one embodiment, the switching transistor STR for a respective word line "WLi" (among the word lines WL0 to WLn-1) may be implemented as a diode transistor having a gate and one end connected to each other and to the word line WLi. The switching transistor STR may sense a voltage level of the word line WLi and may connect the DTR to the respective word line WLi when the voltage level of the word line WLi is logic high (for example, the power supply voltage VDD).

If one of the first to nth word lines WL0 to WLn-1 is driven, one assist circuit connected to the driven word line among the first to n-th assist circuits 321_1 to 321_n is activated, and the DTR included in the one assist circuit may adaptively adjust a voltage level of the driven word line depending upon characteristics of the memory cell MC included in the memory cell array 310 or temperature. Thus, the read disturb phenomenon may be alleviated.

Figure 11B:
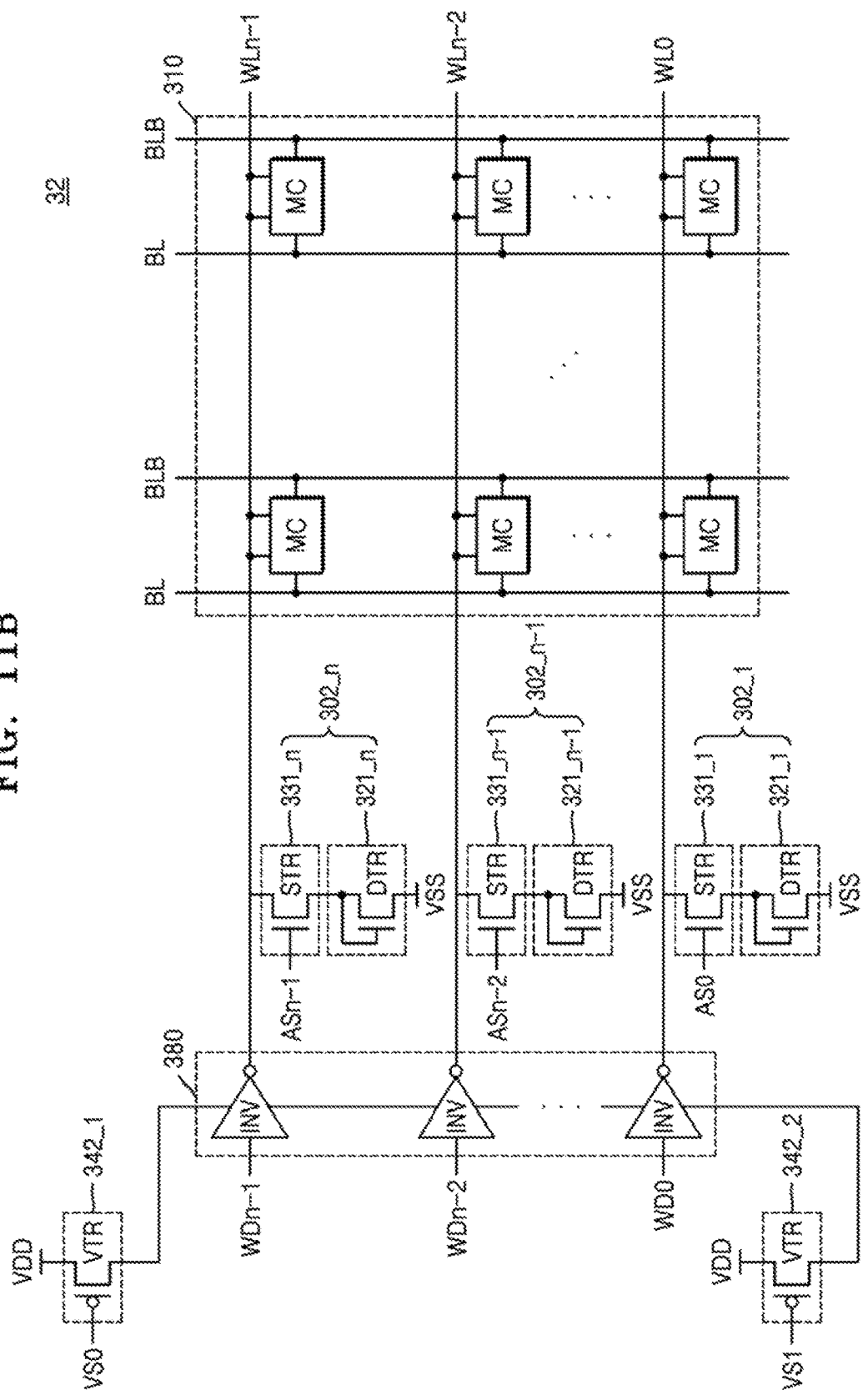
FIG. 11B is a circuit diagram illustrating a memory device according to an example embodiment of the inventive concept.

FIG. 11B is a circuit diagram illustrating a memory device according to an example embodiment of the inventive concept. Specifically, FIG. 11B illustrates an embodiment in which the first to n-th assist switching circuits 331_1 to 331_n are respectively operated based on first to nth assist switching signals AS0 to ASn-1, unlike in FIG. 11A. Thus, the same descriptions as in FIG. 11A except the above different point will be omitted.

Referring to FIGS. 10 and 11B, a memory device 32 may include the memory cell array 310, first to nth voltage control circuits 302_1 to 302_n, a first power supply circuit 342_1, a second power supply circuit 342_2, and the word line driver 380. The first to n-th voltage control circuits 302_1 to 302_n may respectively include first to n-th assist circuits 322_1 to 322_n and also respectively include first to n-th assist switching circuits 332_1 to 332_n. Since the memory cell array 310, the first to n-th assist circuits 322_1 to 322_n, the word line driver 380, the first power supply circuit 342_1, and the second power supply circuit 342_2 may be identical or similar to the memory cell array 310, the first to n-th assist circuits 321_1 to 321_n, the word line driver 380, the first power supply circuit 341_1, and the second power supply circuit 341_2 of FIG. 11A, respectively, descriptions thereof will be omitted.

The first to n-th assist switching circuits 332_1 to 332_n may respectively receive the first to n-th assist switching signals AS0 to ASn-1, and may respectively perform switching between the first to n-th assist circuits 322_1 to 322_n and the first to n-th word lines WL0 to WLn-1 based thereon. In one embodiment, the first to n-th assist switching signals AS0 to ASn-1 may be respectively synchronized with the first to n-th word line driving signals WD0 to WDn-1.

In the embodiments of FIGS. 11A and 11B, any of the voltage control circuits 301_1 to 301_n or 302_1 to 302_n may adjust a level of the driving voltage of the word line based on characteristics of the DTR included therein, depending on at least one of a threshold voltage of one or more memory cells in memory cell array 310, or temperature.

Figure 12:
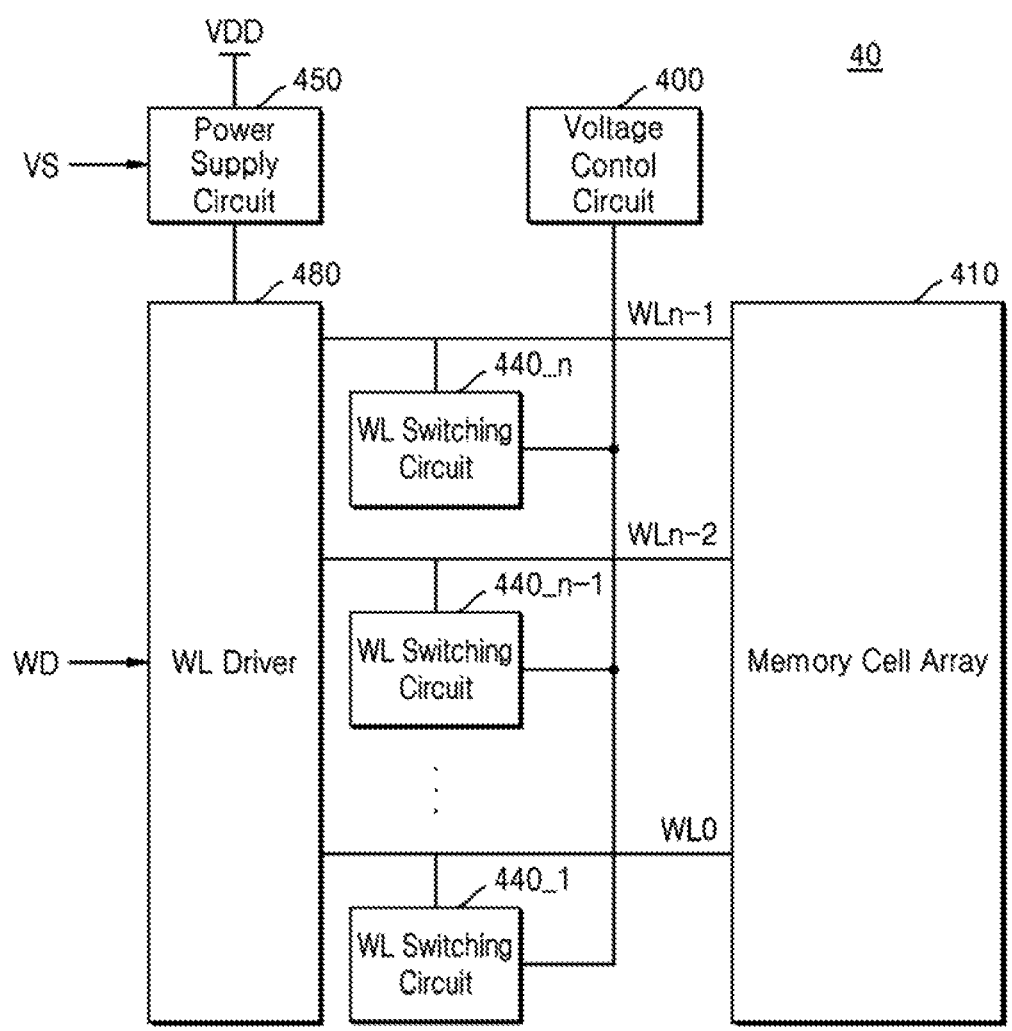
FIG. 12 is a block diagram illustrating a memory device according to an example embodiment of the inventive concept.

FIG. 12 is a block diagram illustrating a memory device according to an example embodiment of the inventive concept. Descriptions identical to those made with reference to FIG. 2 will be omitted.

Referring to FIG. 12, a memory device 40 may include a voltage control circuit 400, a memory cell array 410, first to n-th word line switching circuits 440_1 to 440_n, a power supply circuit 450, and a word line driver 480. Since the memory cell array 410, the power supply circuit 450, and the word line driver 480 may be substantially identical or similar to the memory cell array 110, the power supply circuit 140, and the word line driver 180 of FIG. 2, respectively, descriptions thereof will be omitted.

The first to n-th word line switching circuits 440_1 to 440_n may be respectively connected to the first to n-th word lines WL0 to WLn-1. The first to n-th word line switching circuits 440_1 to 440_n may respectively perform switching between the first to n-th word lines WL0 to WLn-1 and the voltage control circuit 400 based on whether the first to n-th word lines WL0 to WLn-1 are driven. In one embodiment, when a word line connected to each of the first to n-th word line switching circuits 440_1 to 440_n among the first to n-th word lines WL0 to WLn-1 is driven, each of the first to n-th word line switching circuits 440_1 to 440_n may connect the voltage control circuit 400 to the driven word line.

The voltage control circuit 400 may include an assist circuit including at least one diode NMOS transistor, and an assist switching circuit performing switching between the assist circuit and each of the first to nth word lines WL0 to WLn-1. In one embodiment, the assist switching circuit may be present for each word line, and, together with the assist circuit, may share the word lines in common.

Figure 13:
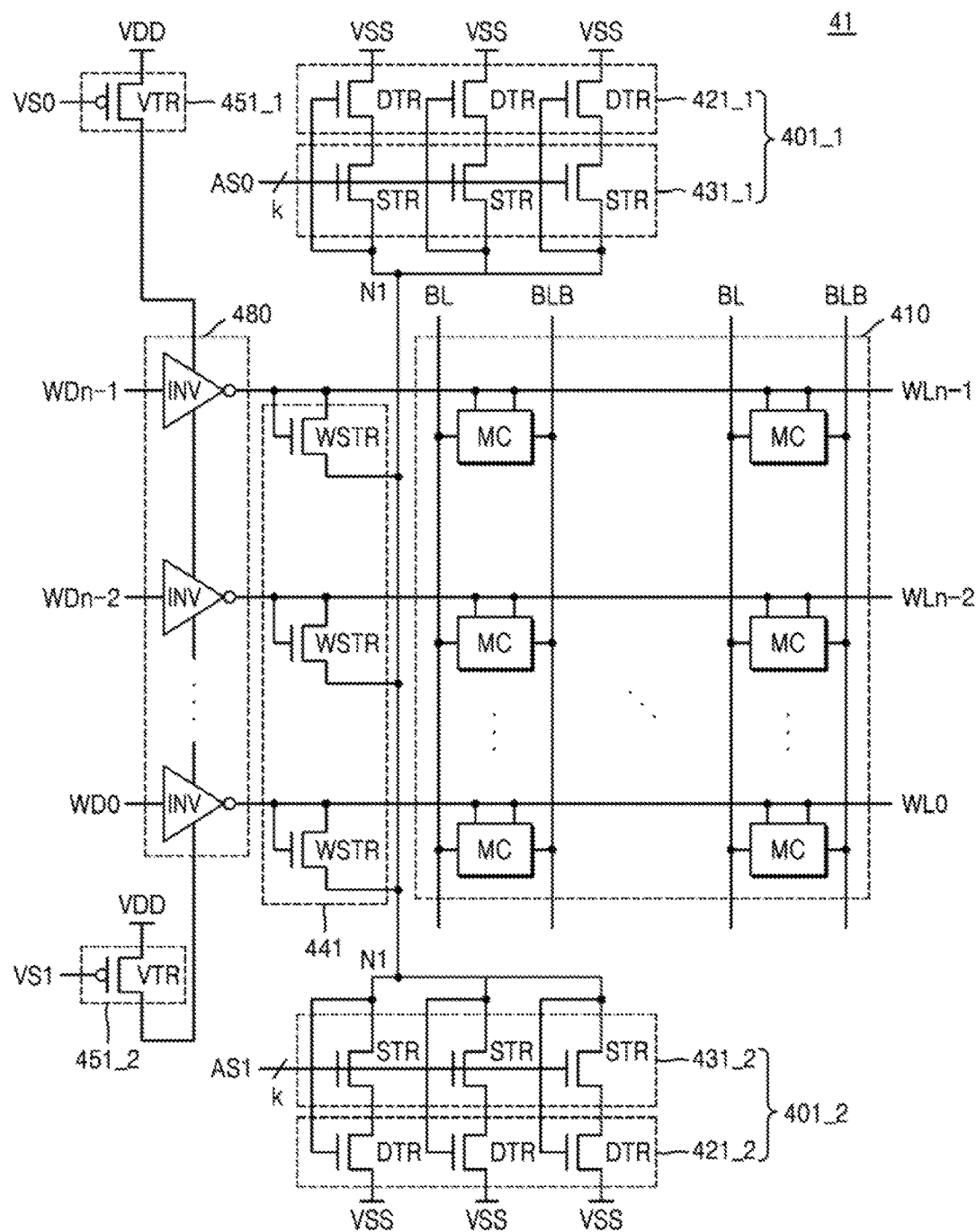
FIG. 13 is a circuit diagram illustrating a memory device according to an example embodiment of the inventive concept.

FIG. 13 is a circuit diagram illustrating a memory device according to an example embodiment of the inventive concept. Descriptions identical to those made with reference to FIG. 3 will be omitted.

Referring to FIGS. 12 and 13, a memory device 41 may include the memory cell array 410, a first voltage control circuit 401_1, a second voltage control circuit 401_2, a word line switching circuit 441, a first power supply circuit 451_1, a second power supply circuit 451_2, and the word line driver 480. The first voltage control circuit 401_1 may include a first assist circuit 421_1 and a first assist switching circuit 431_1, and the second voltage control circuit 401_2 may include a second assist circuit 421_2 and a second assist switching circuit 431_2.

The memory cell array 410 and the word line driver 480 shown in FIG. 13 may respectively correspond to detailed circuit diagrams of the memory cell array 410 and the word line driver 480 of FIG. 12, and each of the first voltage control circuit 401_1 and the second voltage control circuit 401_2 may correspond to an embodiment of a detailed circuit diagram of the voltage control circuit 400 of FIG. 12. In addition, the word line switching circuit 441 may correspond to an embodiment of a detailed circuit diagram of the first to nth word line switching circuits 440_1 to 440_n of FIG. 12, and each of the first power supply circuit 451_1 and the second power supply circuit 451_2 may correspond to an embodiment of a detailed circuit diagram of the power supply circuit 450 of FIG. 12. Since the memory cell array 410, the word line driver 480, the first power supply circuit 451_1, and the second power supply circuit 451_2 may be identical or similar to the memory cell array 110, the word line driver 180, the first power supply circuit 141_1, and the second power supply circuit 141_2 of FIG. 3, respectively, descriptions thereof will be omitted.

Each of the first assist circuit 421_1 and the second assist circuit 421_2, may include at least one diode NMOS transistor DTR. Since a gate of the at least one diode NMOS transistor DTR is connected to the first node N1, when the first assist switching circuit 431_1 and the second assist switching circuit 431_2 are turned on, the gate and one end of the at least one diode NMOS transistor DTR may be electrically connected to each other, whereby the at least one diode NMOS transistor DIM may have a form of a diode transistor. Although the gate of the at least one diode NMOS transistor DTR is shown in FIG. 13 as being connected to the first node N1, alternatively, the gate of the DTR may be connected to its own end (e.g. to its drain) as in the DTR examples of FIGS. 3-11B.

Each of the first assist switching circuit 431_1 and the second assist switching circuit 431_2 may include at least one switching transistor STR. One end of the at least one switching transistor STR may be connected to the first node N1, the other end thereof may be connected to the diode NMOS transistor DTR, and the first assist switching signal AS0 or the second assist switching signal AS1 may be applied to a gate of the at least one switching transistor STR. The first assist switching circuit 431_1 may receive the first assist switching signal AS0, and may perform switching between the first node N1 and the diode NMOS transistor DTR of the first assist circuit 421_1 based thereon. The second assist switching circuit 431_2 may receive the second assist switching signal AS1, and may perform switching between the first node N1 and the diode NMOS transistor DTR of the second assist circuit 421_2 based thereon.

In one embodiment, each of the first assist switching signal AS0 and the second assist switching signal AS1 may include information on the degree of voltage control. For instance, as in the case of FIG. 8, each of the first and second assist switching signals AS0, AS1 may be provided across an integer "k" lines. In the case where three switching transistors STR are provided (as in FIG. 13), an example may be k=2, so that first and second lines together carry the assist switching signal AS0 or AS1 as a binary signal. The first line may be connected to the gates of two switching transistors STR while the second line may be connected to the gate of only the remaining one of the three switching transistors STR. The first assist switching circuit 431_1 may selectively turn on the at least one switching transistor STR based on the first assist switching signal AS0. For example, when the first assist switching signal AS0 is "00", the first assist switching circuit 431_1 may turn off all of switching transistors STR, and when the first assist switching signal AS0 is "01", the first assist switching circuit 431_1 may turn on one of the switching transistors STR. In addition, when the first assist switching signal AS0 is "10", the first assist switching circuit 431_1 may turn on two of the switching transistors STR, and when the first assist switching signal AS0 is "11", the first assist switching circuit 431_1 may turn on all of the switching transistors STR.

The assist switching circuit 431_1 may selectively turn on the switching transistors STR based on the first assist switching signal AS0, whereby the number and combination of the diode NMOS transistors connected to the first node N1 may vary. Thus, a degree of a voltage drop of each of the word lines WL0 to WLn-1 may be adjusted. Since the second assist switching circuit 431_2 may also be operated in an identical or similar manner to the assist switching circuit 431_1, descriptions thereof will be omitted.

The word line switching circuit 441 may include a plurality of word line switching transistors WSTR respectively connected to the first to n-th word lines WL0 to WLn-1. In one embodiment, a word line switching transistor WSTR may be an NMOS transistor. A gate and one end of the word line switching transistor WSTR may be connected to each of the first to n-th word lines WL0 to WLn-1, and the other end thereof may be connected to the first node N1. The word line switching transistor WSTR may sense a voltage level of each of the first to n-th word lines WL0 to WLn-1, and when a voltage level of each of the first to nth word lines WL0 to WLn-1 is logic high (for example, the power supply voltage VDD), the word line switching transistor WSTR may connect the diode NMOS transistor included in each of the first assist circuit 421_1 and the second assist circuit 421_2 to each driven word line among the first to nth word lines WL0 to WLn-1.

If one of the first to n-th word lines WL0 to WLn-1 is driven, the driven word line is connected to the diode NMOS transistor DTR, and the diode NMOS transistor DTR may adaptively adjust the voltage level of the driven word line depending upon characteristics of the memory cell MC included in the memory cell array 410 or a temperature. In addition, the number or kinds of the diode NMOS transistors DTR connected to each word line may vary based on the assist switching signals AS0 and AS1, whereby the voltage level of the driven word line may be adaptively adjusted. Thus, the read disturb phenomenon may be improved.

Although FIG. 13 illustrates an embodiment, in which the number of the switching transistors STR included in each of the first assist switching circuit 431_1 and the second assist switching circuit 431_2 is three, and in which the number of the diode NMOS transistors included in each of the first assist circuit 421_1 and the second assist circuit 421_2 is three, this is merely an example, and each of the numbers thereof may be greater than or less than three.

Figure 14:
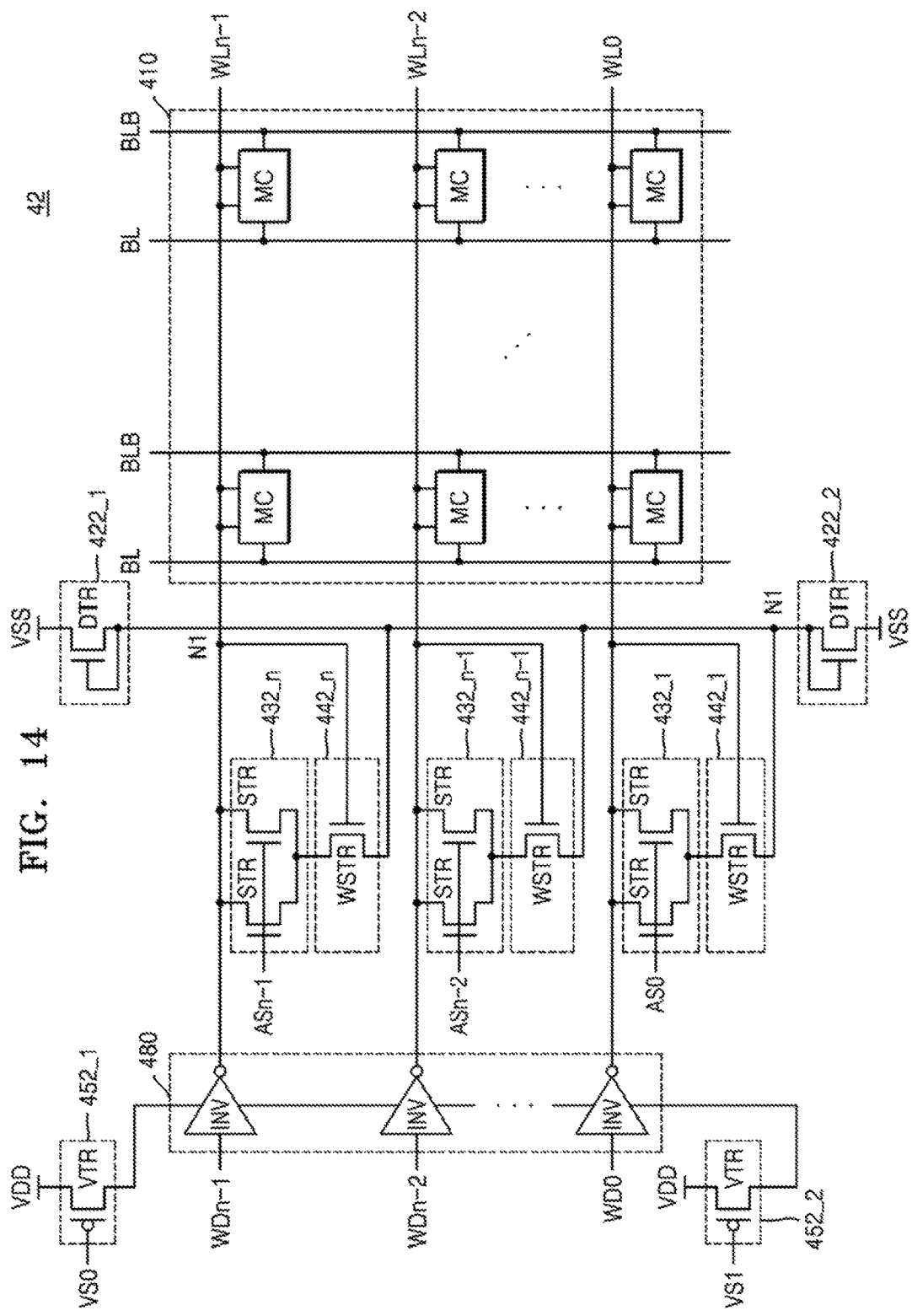
FIG. 14 is a circuit diagram illustrating a memory device according to an example embodiment of the inventive concept.

FIG. 14 is a circuit diagram illustrating a memory device according to an example embodiment of the inventive concept. Specifically, FIG. 14 illustrates an embodiment in which the assist switching circuit includes first to n-th assist switching circuits 432_1 to 432_n respectively connected to the first to nth word lines WL0 WLn-1, unlike in FIG. 13. Thus, the same descriptions as in FIG. 13 except the above different point will be omitted.

Referring to FIGS. 12 and 14, a memory device 42 may include the memory cell array 410, a first assist circuit 422_1, a second assist circuit 422_2, the first to nth assist switching circuit 432_1 to 432_21, first to nth word line switching circuits 442_1 to 442_n, a first power supply circuit 452_1, a second power supply circuit 452_2, and the word line driver 480. Since the memory cell array 410, the word line driver 480, the first power supply circuit 452_1, and the second power supply circuit 452_2 may be identical or similar to the memory cell array 110, the word line driver 180, the first power supply circuit 141_1, and the second power supply circuit 141_2 of FIG. 3, respectively, descriptions thereof will be omitted.

Each of the first assist circuit 422_1 and the second assist circuit 422_2 may include at least one diode NMOS transistor having a gate and one end, which are connected to the first node N1, and having the other end, to which the ground voltage VSS is applied.

Each of the first to n-th word line switching circuits 442_1 to 442_n may include a word line switching transistor WSTR, which has one end connected to the first node N1, the other end connected to each of the first to nth assist switching circuits 432_1 to 432_n, and a gate connected to each of the first to n-th word lines WL0 to WLn-1. The first to nth word line switching circuits 442_1 to 442_n may respectively sense voltage levels of the first to n-th word lines WL0 to and WLn-1, and when the voltage levels of the first to n-th word lines WL0 to WLn-1 are logic high (for example, the power supply voltage VDD), the first to n-th word line switching circuits 442_1 to 442_n may respectively connect ends of the first to nth assist switching circuits 432_1 to 432_n to the diode NMOS transistor DTR included in each of the first assist circuit 421_1 and the second assist circuit 422_2.

Each of the first to n-th assist switching circuits 432_1 to 432_n may include at least one switching transistor STR. One end of the at least one switching transistor STR may be connected to each of the first to n-th word lines WL0 to WLn-1, the other end thereof may be connected to each of the first to nth word line switching circuits 442_1 to 442_*n*, and each of the first to n-th assist switching signals AS0 to ASn-1 may be applied to a gate thereof. The first to n-th assist switching circuits 432_1 to 432_*n* may respectively receive the first to n-th assist switching signals AS0 to ASn-1, and respectively perform switching between the first to n-th word lines WL0 to WLn-1 and the first to n-th word line switching circuits 442_1 to 442_*n* based thereon.

The first to n-th assist switching circuits 432_1 to 432_*n* may selectively turn on the switching transistors STR based on the first to n-th assist switching signals AS0 to ASn-1, respectively, whereby the number of routes connected to each of the first assist circuit 422_1 and the second assist circuit 422_2 may vary. Thus, the degree of the voltage drop of each of the word lines WL0 to WLn-1 may be adjusted.

If one of the first to n-th word lines WL0 to WLn-1 is driven, the driven word line is connected to the diode NMOS transistor DTR, and the diode NMOS transistor DTR may adaptively adjust the voltage level of the driven word line depending upon characteristics of the memory cell MC included in the memory cell array 410 or a temperature. In addition, the number of routes connected to each word line may vary based on the assist switching signals AS0 to ASn, whereby the voltage level of the driven word line may be adaptively adjusted. Thus, the read disturb phenomenon may be improved.

Figure 15:
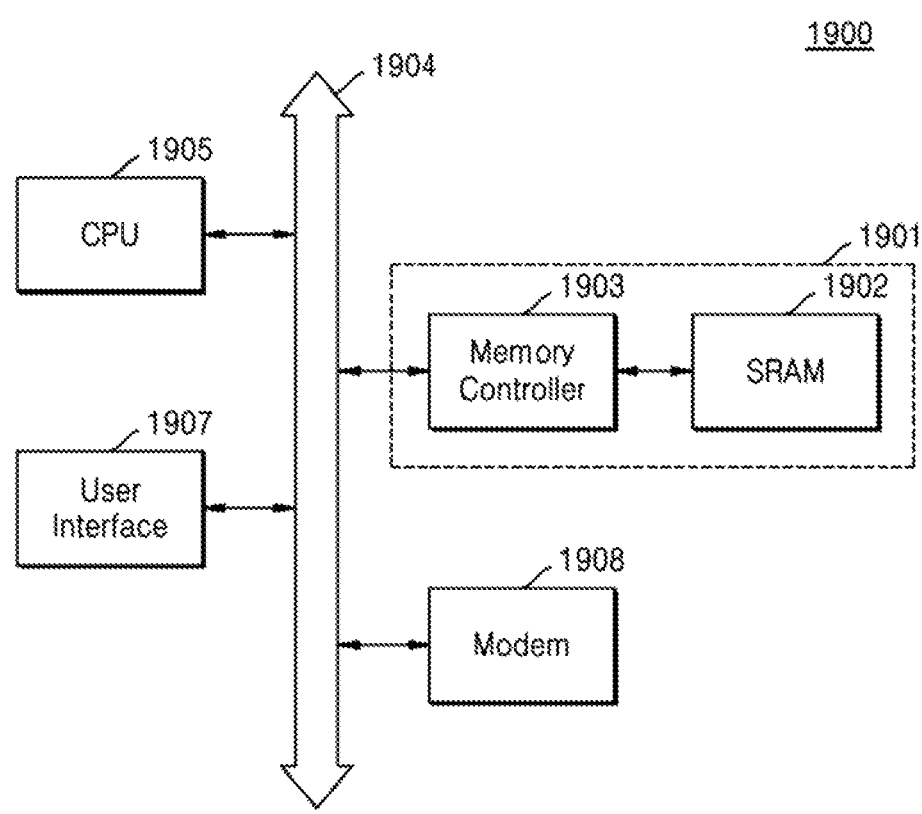
FIG. 15 is a block diagram illustrating a computer system according to an example embodiment of the inventive concept.

FIG. 15 is a block diagram illustrating a computer system 1900 according to an example embodiment of the inventive concept. Computer system 1900 may be mounted in mobile devices, desktop computers, and the like. The computer system 1900 may include an SRAM memory system 1901, a central processing unit 1905, a user interface 1907, and a modem 1908 such as a baseband chipset, which are electrically connected to a system bus 1904. The computer system 1900 may further include an application chipset, a camera image processor (CIS), an input/output device, or the like.

The user interface 1907 may be an interface for transmitting data to a communication network or receiving data from the communication network. The user interface 1907 may be of a wired or wireless type, and may include an antenna, a wired or wireless transceiver, or the like. Data provided through the user interface 1907 or the modem 1908 or processed by the central processing unit 1905 may be stored in the SRAM memory system 1901.

The SRAM memory system 1901 may include the memory system described with reference to FIGS. 1 to 14. The SRAM memory system 1901 may include SRAM 1902 and a memory controller 1903. Data processed by the central processing unit 1905 or data input from an outside of the computer system 1900 may be stored in the SRAM 1902. The SRAM 1902 may include a diode NMOS transistor having one end and a gate connected to each other, and may adaptively adjust a voltage level of a driven word line depending upon characteristics of a memory cell or a temperature.

When the computer system 1900 is an apparatus performing wireless communication, the computer system 1900 may be used for communication systems such as code division multiple access (CDMA), global system for mobile communication (GSM), North American multiple access (NADC), or CDMA2000. The computer system 1900 may be mounted in information processing devices such as personal digital assistants (PDAs), portable computers, web tablets, digital cameras, portable media players (PMPs), mobile phones, wireless phones, or laptop computers.

While the inventive concept has been particularly shown and described with reference to embodiments thereof, it will be understood that various changes in form and details may be made therein without departing from the spirit and scope of the inventive concept as defined by the following claims.

What is claimed is:

1. A memory device comprising:
   a volatile memory cell array connected to a plurality of word lines and comprising a memory cell that comprises at least one transistor;
   a word line driver connected to the plurality of word lines, wherein a first node is connected to the word line driver and receives a voltage derived from a main power supply voltage; and
   an assist circuit comprising an N-channel metal oxide semiconductor (NMOS) transistor having a diode connection structure, the NMOS transistor having a drain to source path connected between the first node and a point of reference potential, the assist circuit adjusting a word line voltage of a word line among the plurality of word lines by performing voltage pull-down for the first node.

2. The memory device according to claim 1, wherein the assist circuit adaptively adjusts the word line driving voltage based on at least one of cell characteristics of the at least one transistor and temperature at the memory device.

3. The memory device according to claim 2, wherein the assist circuit sets the word line driving voltage lower as the temperature increases.

4. The memory device according to claim 2, wherein, at a given temperature, the assist circuit is operable to reduce the word line driving voltage from the main power supply voltage to a first level when the at least one transistor has a first threshold voltage, and to reduce the word line driving voltage to a second level, which is lower than the first level, when the at least one transistor has a second threshold voltage,
   where the first threshold voltage is higher than the second threshold voltage.

5. The memory device according to claim 1, wherein the word line driver is operable to drive a first word line among the plurality of word lines in response to a word line driving signal, and the memory device further comprising:
   a power supply circuit applying voltage derived from the main power supply voltage to the first word line through the first node.

6. The memory device according to claim 5, further comprising:
   an assist switching circuit performing switching between the assist circuit and the first node in response to an assist switching signal.

7. The memory device according to claim 6, wherein the assist switching circuit connects the assist circuit to the first node when the word line driver drives the first word line.

8. The memory device according to claim 7, wherein:
   the assist switching circuit comprises a first transistor having a first end connected to the first node and a second end connected to the assist circuit;
   the power supply circuit comprises a second transistor having a first end connected to receive the main power supply voltage and a second end connected to the first node; and
   the first transistor of the power supply circuit and the second transistor of the assist switching circuit are controlled to turn ON concurrently to cause the word line driver to drive the first word line with a voltage at the first node.

9. The memory device according to claim 5, wherein the word line driver comprises a first word line driver and a second word line driver and the assist circuit comprises:
a first assist circuit connected to a first word line driver driving a word line at an uppermost level among the plurality of word lines; and
a second assist circuit connected to a second word line driver driving a word line at a lowermost level among the plurality of word lines.

10. The memory device of claim 8, wherein the first transistor of the assist switching circuit is an NMOS transistor and the second transistor of the power supply circuit is a PMOS transistor.

11. A memory device comprising:
a volatile memory cell array connected to a plurality of word lines and comprising a memory cell that comprises at least one transistor;
a word line driver connected to the plurality of word lines; and
an assist circuit configured to adjust a word line driving voltage of a word line among the plurality of word lines, wherein the assist circuit comprises an N-channel metal oxide semiconductor (NMOS) transistor having a diode connection structure; and
a word line switching circuit comprising a plurality of word line switching transistors and performing switching between the plurality of word lines and the assist circuit, each of the plurality of word line switching transistors having one end connected to the assist circuit and having another end and a gate connected to a respective one of the plurality of word lines,
wherein the assist circuit is simultaneously connected to the plurality of word line switching transistors.

12. The memory device according to claim 11, wherein the assist circuit comprises a plurality of NMOS transistors having diode connection structures,
the memory device further comprising:
an assist switching circuit connecting at least one of the plurality of NMOS transistors to a driven first word line among the plurality of word lines in response to an assist switching signal and thereby adjusting a driving voltage level of the first word line.

13. The memory device according to claim 11, further comprising:
an assist switching circuit connected between each of the plurality of word lines and each of the plurality of word line switching transistors and adjusting the driving voltage level of each of the plurality of word lines by varying a number of connection routes between the assist circuit and each of the plurality of word lines in response to an assist switching signal.

14. The memory device according to claim 13, wherein:
the assist switching signal is provided as a binary signal across an integer k parallel lines;
the assist switching circuit comprises a plurality of FET switching transistors, each having a gate connected to one of the k parallel lines, and switching on or off based on a logic level of the assist switching signal applied to its gate.

15. A memory device comprising:
a volatile memory cell array connected to word lines and comprising a memory cell that comprises at least one transistor;
a word line driver driving each of the word lines by applying a word line driving voltage to each of the word lines, respectively, in response to a word line driving signal;
a power supply circuit connected to the word line driver via a first node and applying a power supply voltage to the first node in response to a voltage switching signal; and
an assist circuit comprising at least one NMOS transistor having a first end connected to a gate thereof to form a diode connection structure, the first end having substantially the same potential as that of the first node, the assist circuit controlling a level of the word line driving voltage by reducing a level of the power supply voltage at the first node based on characteristics of the at least one NMOS transistor,
wherein the assist circuit adjusts the level of the word line driving voltage depending upon at least one of a threshold voltage of the at least one transistor included in the memory cell, or temperature.

16. The memory device according to claim 15, wherein:
a second end of the at least one NMOS transistor is tied to a point of reference potential; and
the memory device further including an assist switching circuit transistor connected in series between the first node and the at least one NMOS transistor, wherein the first end of the at least one NMOS transistor has substantially the same potential as that of the first node when the assist switching circuit transistor is turned ON.

17. The memory device according to claim 15, wherein the assist circuit comprises:
a first assist circuit connected to a first word line driver driving a word line at an uppermost level among the word lines; and
a second assist circuit connected to a second word line driver driving a word line at a lowermost level among the word lines.

18. A memory device comprising:
a volatile memory cell array connected to a plurality of word lines and comprising a memory cell that comprises at least one transistor;
an assist circuit connected to the plurality of word lines and configured to adjust a word line driving voltage of a selected word line, wherein the assist circuit comprises a plurality of N-channel metal oxide semiconductor (NMOS) transistors each having a diode connection structure; and
an assist switching circuit comprising a plurality of switching transistors, each respectively performing switching between a corresponding one of the plurality of NMOS transistors and a corresponding word line of the plurality of word lines.

19. The memory device according to claim 18, wherein gates of the plurality of switching transistors are respectively connected to the plurality of word lines, and each switching transistor of the assist switching circuit senses a voltage level of a corresponding word line and connects the corresponding NMOS transistor to the word line when the sensed voltage level is logic high.

20. The memory device according to claim 19, wherein one end of each of the plurality of switching transistors is connected to one of the plurality of NMOS transistors comprised in the assist circuit, and another end and the gate thereof are connected to one of the plurality of word lines.

21. The memory device according to claim 18, wherein the assist switching circuit receives a switching signal from outside the memory device, and respectively connects the plurality of NMOS transistors to the plurality of word lines based on the switching signal.

\* \* \* \* \*